(12) United States Patent
Ishii et al.

(10) Patent No.: US 9,515,000 B2
(45) Date of Patent: Dec. 6, 2016

(54) METHOD FOR MANUFACTURING SEMICONDUCTOR DEVICE

(71) Applicant: Renesas Electronics Corporation, Koutou-ku, Tokyo (JP)

(72) Inventors: Toshitsugu Ishii, Gunma (JP); Naohiro Makihira, Gunma (JP); Hidekazu Iwasaki, Gunma (JP); Jun Matsuhashi, Gunma (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/929,252

(22) Filed: Oct. 30, 2015

(65) Prior Publication Data
US 2016/0141215 A1 May 19, 2016

(30) Foreign Application Priority Data
Nov. 18, 2014 (JP) .................................. 2014-233829

(51) Int. Cl.
*G01R 31/00* (2006.01)
*H01L 21/66* (2006.01)
*H01L 21/56* (2006.01)
*G01R 31/26* (2014.01)
*G01R 1/04* (2006.01)
(Continued)

(52) U.S. Cl.
CPC ............. *H01L 22/14* (2013.01); *G01R 1/0466* (2013.01); *G01R 1/06716* (2013.01); *G01R 1/07357* (2013.01); *G01R 31/2601* (2013.01); *H01L 21/565* (2013.01); *H01L 22/30* (2013.01); *H01L 2224/32245* (2013.01); *H01L 2224/48247* (2013.01); *H01L 2224/73265* (2013.01); *H01L 2924/181* (2013.01)

(58) Field of Classification Search
None
See application file for complete search history.

(56) References Cited

U.S. PATENT DOCUMENTS 6,255,126 B1 * 7/2001 Mathieu ............. G01R 1/06727
438/14
6,293,814 B1 9/2001 Tan
(Continued)

FOREIGN PATENT DOCUMENTS

DE   10 2006 03790 A1   2/2008
DE   10 2007 05836 A1   6/2009
(Continued)

OTHER PUBLICATIONS

Extended European search report for European Patent Application No. 15194183.8, Apr. 14, 2016.

*Primary Examiner* — Evren Seven
(74) *Attorney, Agent, or Firm* — Shapiro, Gabor and Rosenberger, PLLC

(57) ABSTRACT

The reliability of multipoint contact by a contact pin with an external terminal is improved while achieving an improvement in easiness of manufacture of the contact pin. The contact pin includes first and second contact pins. Further, the first contact pin has a support portion extending in a y direction and a tip portion connected to the support portion. The second contact pin also has a support portion extending in the y direction and a tip portion connected to the support portion. Here, the support portion of the first contact pin and the support portion of the second contact pin are arranged side by side along an x direction in a horizontal plane (xy plane). Further, the tip portion of the second contact pin is shifted from the tip portion of the first contact pin along the y direction in the horizontal plane, crossing (perpendicular to) the x direction.

19 Claims, 18 Drawing Sheets

(51) Int. Cl.
*G01R 1/067* (2006.01)
*G01R 1/073* (2006.01)

(56) References Cited

U.S. PATENT DOCUMENTS

| | | | | |
|---|---|---|---|---|
| 8,441,275 B1* | 5/2013 | Alladio | ................. | G01R 1/0466 324/756.01 |
| 2002/0055282 A1* | 5/2002 | Eldridge | .............. | G01R 1/0483 439/66 |
| 2003/0151419 A1* | 8/2003 | Felici | ................. | G01R 1/07342 324/755.07 |
| 2005/0130504 A1* | 6/2005 | Kraemer | ............. | G01R 1/0466 439/638 |
| 2007/0075717 A1* | 4/2007 | Kinghorn | ........... | G01R 1/07378 324/754.18 |
| 2008/0238454 A1* | 10/2008 | Wu | .................... | G01R 1/06772 324/755.01 |
| 2008/0252325 A1* | 10/2008 | Kister | ................ | G01R 1/07307 324/755.1 |
| 2008/0254651 A1* | 10/2008 | Mathieu | .................. | G01R 3/00 439/66 |
| 2010/0164526 A1* | 7/2010 | Pagani | ............... | G01R 1/06716 324/756.03 |
| 2010/0194416 A1* | 8/2010 | Hoshi | ................ | G01R 1/06727 324/754.08 |
| 2010/0264935 A1* | 10/2010 | Erdman | ................ | G01R 1/0466 324/537 |
| 2011/0062978 A1* | 3/2011 | Kister | ................ | G01R 1/06716 324/755.01 |
| 2011/0163774 A1* | 7/2011 | Minami | ............. | G01R 31/2886 324/756.03 |
| 2011/0285416 A1* | 11/2011 | Petersen | ............ | G01R 1/07307 324/755.01 |
| 2013/0049782 A1* | 2/2013 | Vettori | ............... | G01R 1/06727 324/754.1 |
| 2015/0192614 A1* | 7/2015 | Vettori | ............... | G01R 1/06727 324/750.24 |
| 2015/0276808 A1* | 10/2015 | Teranishi | ........... | G01R 1/06733 324/755.07 |
| 2016/0139179 A1* | 5/2016 | Ku | ..................... | G01R 1/06727 324/755.07 |

FOREIGN PATENT DOCUMENTS

| | | |
|---|---|---|
| JP | H10-73634 A | 3/1998 |
| JP | H11-260513 A | 9/1999 |
| JP | H11-297442 A | 10/1999 |
| WO | WO 2013/126016 A1 | 8/2013 |
| WO | WO 2014/167693 A1 | 10/2014 |

* cited by examiner

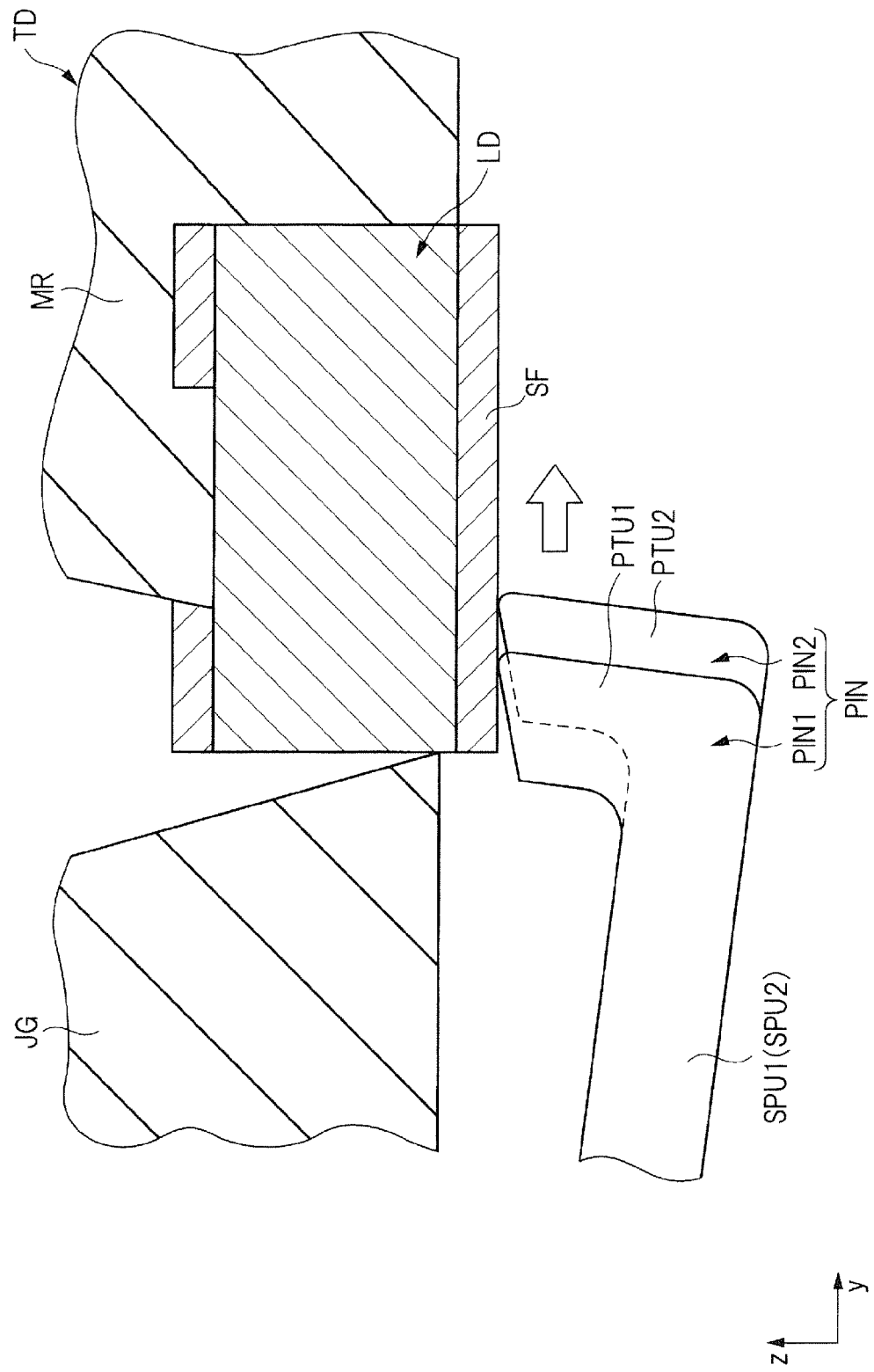

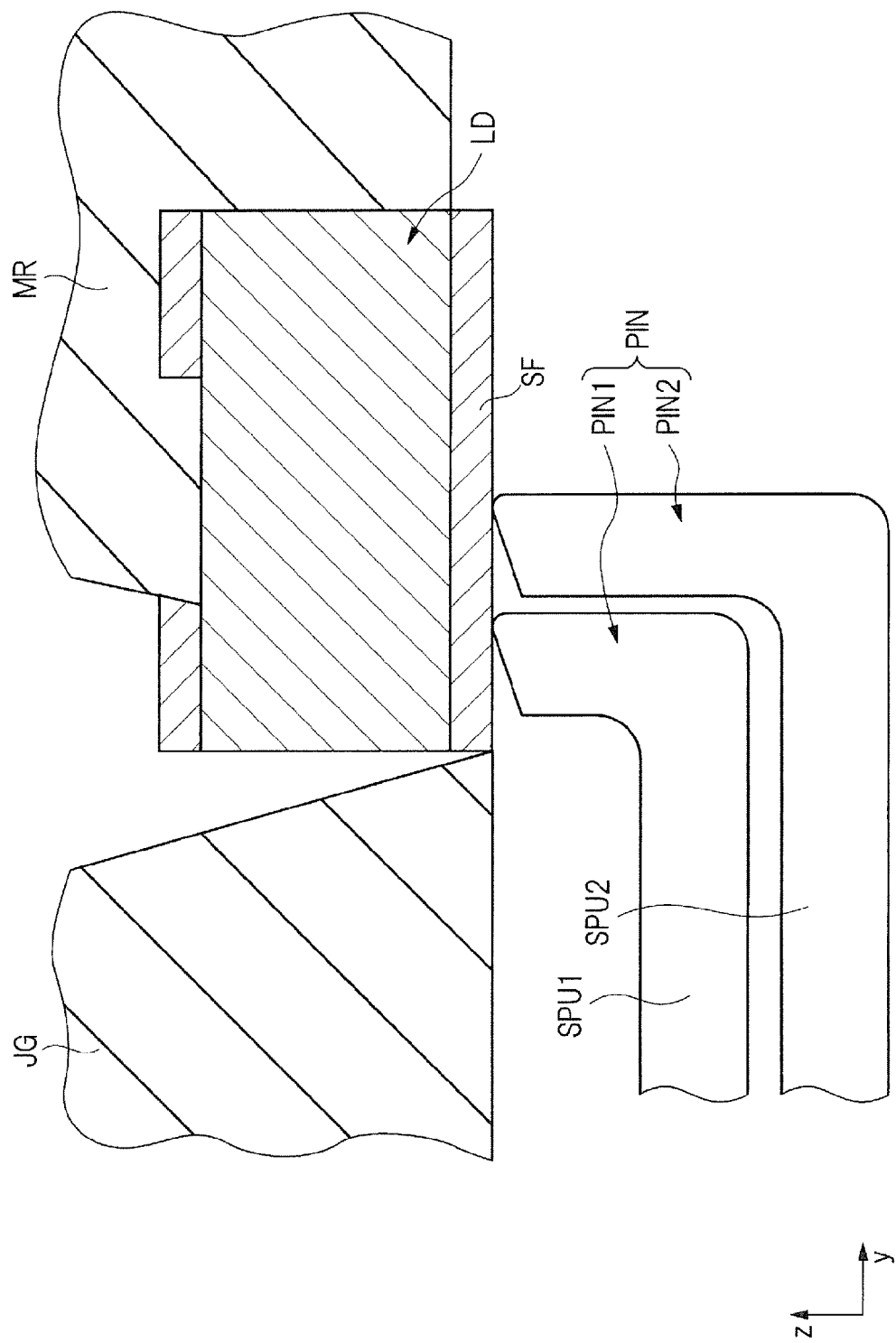

METHOD FOR MANUFACTURING SEMICONDUCTOR DEVICE

CROSS-REFERENCE TO RELATED APPLICATIONS

The disclosure of Japanese Patent Application No. 2014-233829 filed on Nov. 18, 2014 including the specification, drawings and abstract is incorporated herein by reference in its entirety.

BACKGROUND

The present invention relates to a method for manufacturing a semiconductor device, which includes, for example, a step of inspecting electrical characteristics of a semiconductor device.

There has been described in Japanese Unexamined Patent Publication Laid-Open No. Hei 11 (1999)-260513 (Patent Document 1), a mode for carrying out an inspection of electrical characteristics of a semiconductor device using contact pins formed with projections different in height from each other at tip portions thereof as shown in FIG. 5 of Patent Document 1, for example.

There has been described in Japanese Unexamined Patent Publication Laid-Open No. Hei 10 (1998)-73634 (Patent Document 2), a mode for carrying out an inspection of electrical characteristics of a semiconductor device using contact pins arranged side by side along a vertical direction as shown in FIG. 3 of Patent Document 2, for example.

There has been described in Japanese Unexamined Patent Publication Laid-Open No. Hei 11 (1999)-297442 (Patent Document 3), a mode for carrying out an inspection of electrical characteristics of a semiconductor device using contact pins arranged side by side along a vertical direction as shown in FIG. 6 of Patent Document 3, for example.

There has been described in International Patent Publication No. 2014/167693 (Patent Document 4), a mode in which a plurality of projections are provided at a tip portion of a socket terminal to thereby take contact between a lead through which a large current is made to flow, and the socket terminal as multipoint contacts by the projections.

RELATED ART DOCUMENTS

Patent Documents

[Patent Document 1] Japanese Unexamined Patent Publication Laid-Open No. Hei 11 (1999)-260513
[Patent Document 2] Japanese Unexamined Patent Publication Laid-Open No. Hei 10 (1998)-73634
[Patent Document 3] Japanese Unexamined Patent Publication Laid-Open No. Hei 11 (1999)-297442
[Patent Document 4] International Patent Publication No. 2014/167693

SUMMARY

When a large current is made to flow in an inspection step of a power semiconductor device as in the power semiconductor device, it is considered that contact pins each having a plurality of contact parts (projections, convex portions) at parts brought into contact with each of external terminals (leads) of a device to be tested (inspected object) are used as shown in Patent Document 4, for example. Thus, it is possible to disperse a current as compared with the case where an external terminal and a contact pin come into contact with each other only at one spot (point). In other words, it is possible to reduce the value of the current flowing in one contact point. As a result, as described in Patent Document 4, for example, the generation of sparks at each contact pin can be suppressed by a current dispersion effect. It is thus possible to secure the service life of the contact pin.

When, however, the contact parts are adopted for a contact pin having a so-called leaf spring structure, it is necessary to sufficiently adjust the height of each contact part. Specifically, the contact pin is flexed in an inspection step using the contact pin having the leaf spring structure. That is, the tip portion of the contact pin is moved from the position before contact of the external terminal therewith by a load (vertical load) when each external terminal of the device to be tested is brought into contact with the contact pin. As a result, when the shape at which the tip portion of the contact pin is provided with the contact parts is adopted, the height of each contact part of the contact pin must be adjusted such that the contact parts are reliably brought into contact with the external terminal of the device to be tested even if the contact pin is in a flexed state. That is, in the configuration in which the tip portion of the contact pin is provided with the contact parts, high processing accuracy is required to effectively achieve an improvement in the service life of the contact pin by current dispersion. Therefore, there exist room for improvement in terms of easiness of manufacture.

Other problems and novel features will be apparent from the description of the present specification and the accompanying drawings.

A method for manufacturing a semiconductor device according to one aspect of the present invention includes an inspection step of the semiconductor device using a contact pin having a structure shown below. That is, the inspection step of the semiconductor device is carried out by adopting the contact pin having such a configuration that a first support portion of a first contact pin and a second support portion of a second contact pin are arranged side by side along a first direction in a horizontal plane, and a second tip portion of the second contact pin is shifted from a first tip portion of the first contact pin along a second direction in the horizontal plane, which intersects with the first direction.

According to the above one aspect, it is possible to improve the reliability of multipoint contact by a contact pin with each of external terminals while achieving an improvement in easiness of manufacture of the contact pin.

BRIEF DESCRIPTION OF THE DRAWINGS

FIG. 10 is a diagram showing in an enlarged form, the coupling mode between the lead and the contact pin at the time of pressing:

FIG. 14 is a typical diagram showing the configuration of a related art in which two contact pins are arranged side by side along the vertical direction (z direction);

DETAILED DESCRIPTION

Figure 1:
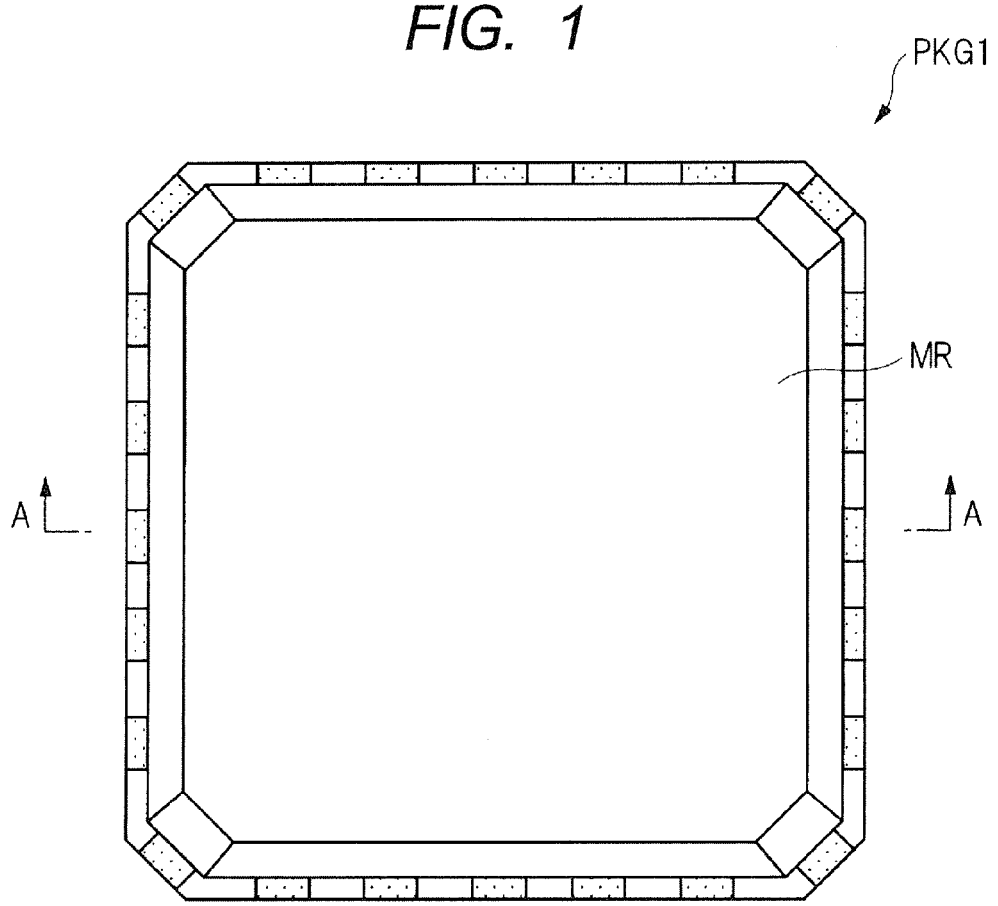
FIG. 1 is a diagram showing a mounting structure of a semiconductor device according to an embodiment and a plan diagram of the semiconductor device as viewed from an upper surface thereof.

The invention will be described by being divided into a plurality of sections or embodiments whenever circumstances require it for convenience in the following embodiments. However, unless otherwise specified in particular, they are not irrelevant to one another. One thereof has to do with modifications, details, supplementary explanations, etc. of some or all of the other.

Also, when reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle.

It is further needless to say that in the following embodiments, components (also including element or factor steps, etc.) employed therein are not always essential except for where otherwise specified in particular and considered to be definitely essential in principle, etc.

Similarly, when reference is made to the shapes, positional relations and the like of the components or the like in the following embodiments, they will include ones substantially analogous or similar to their shapes or the like except for where otherwise specified in particular and considered not to be definitely so in principle, etc. This is similarly applied even to the above-described numerical values and range.

The same reference numerals are respectively attached to the same members in principle in all the drawings for describing the embodiments, and a repeated description thereof will be omitted. Incidentally, even plan diagrams may be hatched to make the drawings easier to understand.

<Mounting Structure of Semiconductor Device>

A semiconductor device (semiconductor package) includes a semiconductor chip formed with a semiconductor element such as a MOSFET (Metal Oxide Semiconductor Field Effect Transistor) (MOSFET may be called a MOS transistor in the present specification). The semiconductor device (semiconductor package) has (1) a function of electrically connecting a semiconductor element formed in the semiconductor chip and an external circuit, and (2) a function of protecting the semiconductor chip from external environments such as moisture, temperature, etc. and preventing breakage due to vibrations or impact and deterioration of the characteristics of the semiconductor chip. Further, the package also has together (3) a function of facilitating handling of the semiconductor chip, (4) a function of radiating generated heat at the operation of the semiconductor chip and exhibiting the function of the semiconductor element to the maximum, etc.

As the structure (form) of the semiconductor device (semiconductor package), there are known various types as in, for example, a BGA (Ball Grid Array), a QFP (Quad Flat Package), a QFN (Quad Flat Non-leaded Package), etc. Of such diversified package forms, the present embodiment will describe, for example, a mounting structure of a semiconductor device comprised of the QFN with reference to the accompanying drawings.

FIG. 1 is a diagram showing a mounting structure of a semiconductor device PKG1 according to the present embodiment and a plan diagram of the semiconductor device PKG1 as viewed from its upper surface (surface). As shown in FIG. 1, the semiconductor device PKG1 according to the present embodiment is covered with a sealing body (resin) MR having a substantially rectangular shape.

Figure 2:
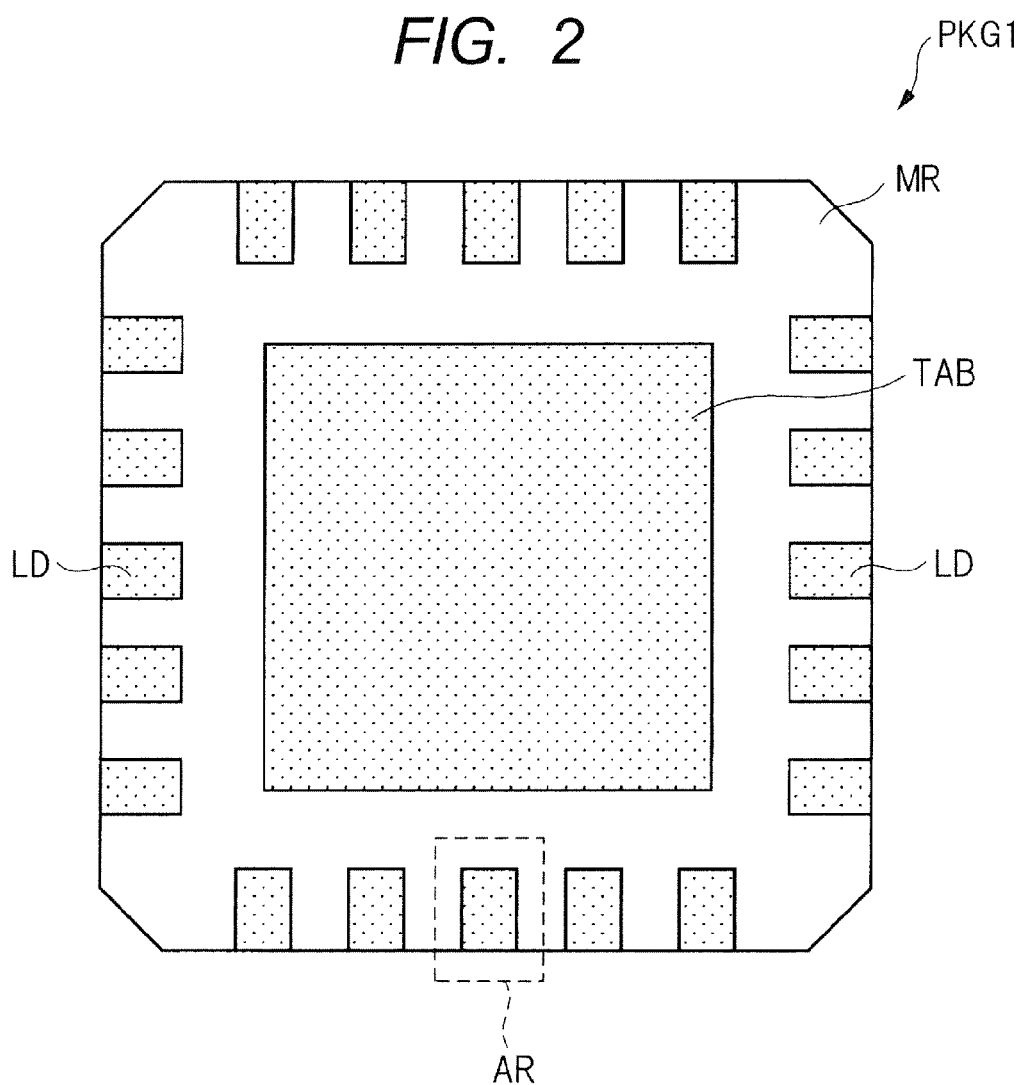
FIG. 2 is a plan diagram of the semiconductor device according to the embodiment as viewed from a lower surface thereof.

Next, FIG. 2 is a plan diagram of the semiconductor device PKG1 according to the present embodiment as viewed from its lower surface (back surface). As shown in FIG. 2, while the back surface of the semiconductor device PKG1 is also covered with the sealing body MR, a chip mounting section TAB is exposed from the sealing body MR. Thus, since the chip mounting section TAB is exposed from the back surface of the semiconductor device PKG1, it is possible to improve heat radiation efficiency of the semiconductor device PKG1. Further, respective one parts (lower surfaces, mounting surfaces) of a plurality of leads LD are also exposed in an outer peripheral area (outer peripheral part) of the semiconductor device PKG1, which is substantially rectangular in shape. Here, in the present specification, the leads LD may be called external terminals.

Figure 3:
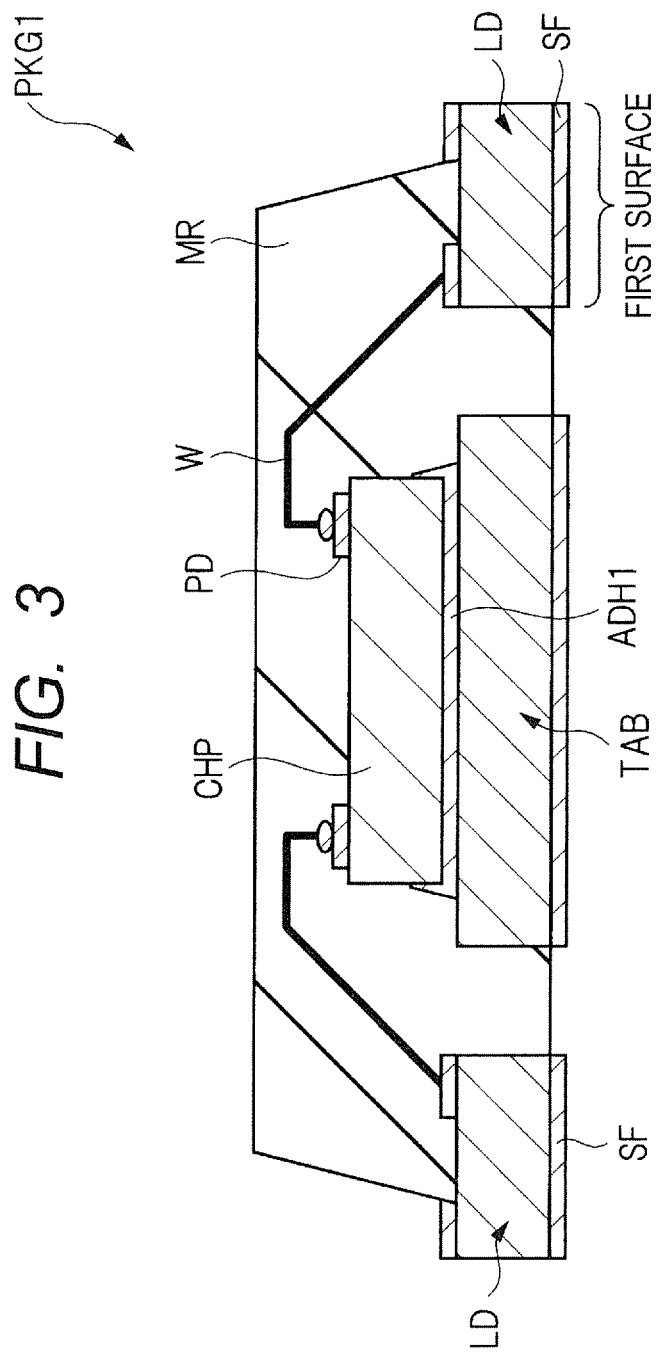
FIG. 3 is a sectional diagram cut along line A-A of FIG. 1.

Subsequently, a description will be made about an internal structure of the semiconductor device PKG1 according to the present embodiment. FIG. 3 is a sectional diagram cut along line A-A of FIG. 1. As shown in FIG. 3, a semiconductor chip CHP is mounted over the chip mounting section TAB through an adhesive ADH1 interposed therebetween. Further, the leads LD are arranged away from the chip mounting section TAB. Pads PD formed over the semiconductor chip CHP and the leads LD are electrically connected to each other by wires W each comprised of a conductive member. Further, parts of the semiconductor chip CHP, the wires W, and the chip mounting section TAB, and parts of the leads LD are covered with the sealing body MR. At this time, the lower surface of the chip mounting section TAB is exposed from the lower surface (back surface, mounting surface) of the sealing body MR. The lower surfaces of the leads LD are also exposed from the lower surface (back surface, mounting surface) of the sealing body MR. Further, a solder film SF is formed over the lower surface of the chip mounting section TAB exposed from the sealing body MR and the lower surfaces of the leads LD exposed from the sealing body MR.

Here, in the semiconductor device PKG1 according to the present embodiment, the lower surface of each lead LD exposed from the sealing body MR corresponds to a "first surface" described in claims. In the case of the semiconductor device PKG1 according to the present embodiment, it can be said that the lower surface ("first surface") of the lead LD is parallel with the horizontal plane. Further, it can be said that the lower surface of the sealing body MR is also substantially parallel with the horizontal plane.

The semiconductor device PKG1 according to the present embodiment is mounted and configured in the above-described manner. Incidentally, since the technical idea in the present embodiment can be applied without being limited to the semiconductor device PKG1 comprised of the QFN although the mounting structure of the semiconductor device PKG1 comprised of the QFN is described in the present embodiment, a mounting structure of a semiconductor device comprised of the QFP will also be described below as a modification of the present embodiment.

MODIFICATION

Figure 4:
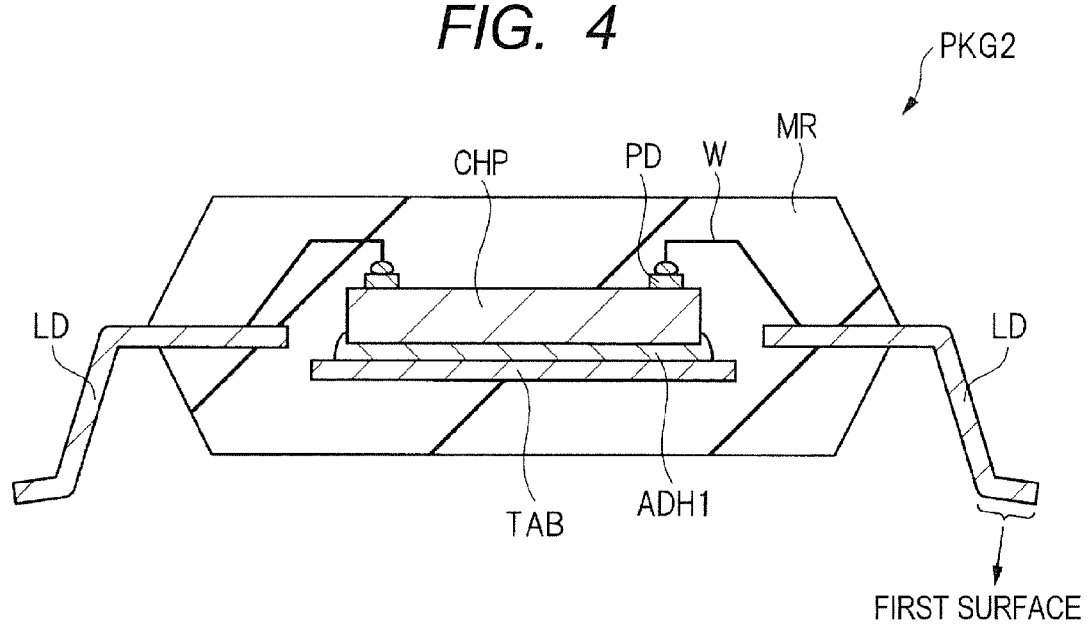
FIG. 4 is a sectional diagram showing a mounting structure of a semiconductor device comprised of a QFP.

FIG. 4 is a sectional view showing amounting structure of a semiconductor device PKG2 comprised of a QFP. As shown in FIG. 4, the semiconductor device PKG2 according to the modification has a chip mounting section TAB. A semiconductor chip CHP is mounted over the chip mounting section TAB through an adhesive ADH1. Further, pads PD formed over the semiconductor chip CHP are electrically connected to leads LD by wires W. Here, the semiconductor chip CHP, wires W, chip mounting section TAB and parts (also called "inner portions") of the leads LD are sealed by a sealing body MR, whereas other parts (also called "outer portions") of the leads LD are exposed (protruded) from the side surfaces (surfaces between upper and lower surfaces) of the sealing body MR. Other parts of the leads LD exposed from the sealing body MR are respectively processed by being bent into a gull wing shape. Particularly, the tip portion of each bent lead LD is processed to be inclined with respect to the horizontal plane. At this time, in the semiconductor device PKG2 according to the present modification as shown in FIG. 4, the lower surface of the tip portion of the bent lead LD corresponds to a "first surface" described in claims. Thus, in the case of the semiconductor device PKG2 according to the present modification, it can be said that the "first surface" of the lead LD is inclined with respect to the horizontal plane. On the other hand, it can be said that the lower surface of the sealing body MR is substantially parallel with the horizontal plane.

<Manufacturing Method of Semiconductor Device (Device to be Tested)>

Figure 5:
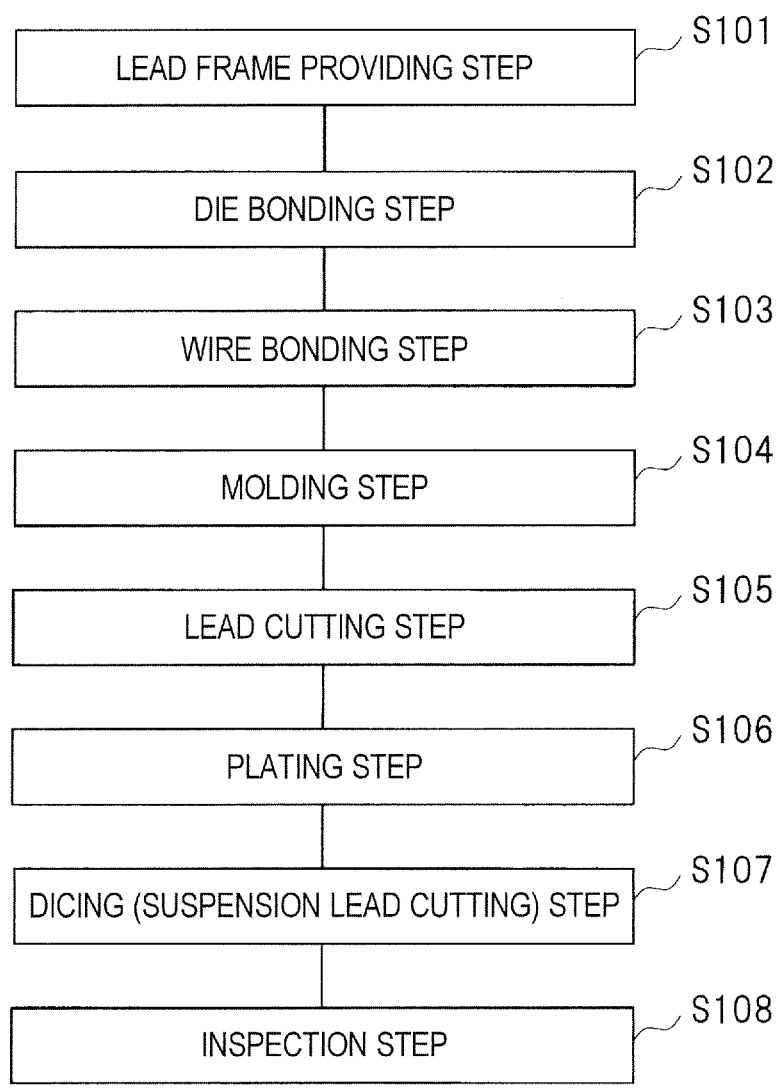
FIG. 5 is a flowchart showing the flow of a manufacturing process of the semiconductor device according to the embodiment.

A method for manufacturing a semiconductor device (device to be tested) according to the present embodiment will next be described. FIG. 5 is a flowchart showing the flow of a manufacturing process of the semiconductor device according to the present embodiment.

1. Base Material (Lead Frame) Providing Step (S101)

First, for example, a lead frame provided in a main process is provided with a plurality of device areas (product areas) arranged inside a frame section (frame body) in a matrix form. Each of the device areas is formed with a chip mounting section supported by suspension leads, and a plurality of leads. The lead frame configured in this way is comprised of a metal and formed of a metal comprised principally of, for example, copper.

Here, the "principal component" mentioned in the present specification refers to the most contained material component in component materials which configure a member. For example, a "material comprised principally of copper" means that copper is contained most in the material of a member. The intention to use the term "principal component" in the present specification is used to express that, for example, a member is basically comprised of copper, but does not exclude containing impurities in addition to that.

2. Die Bonding Step (S102)

Next, in a die bonding step shown in FIG. 5, a semiconductor chip is mounted over the chip mounting section. Specifically, the semiconductor chip has a front surface formed with a plurality of pads thereon, and aback surface positioned on the opposite side of the front surface. The semiconductor chip is mounted over the chip mounting section via a die bond material corresponding to an adhesive in a state in which the back surface of the semiconductor chip is made opposite to the side of the chip mounting section. As a result, the semiconductor chip mounted over the chip mounting section is arranged over the chip mounting section in such a manner that the front surface formed with the pads formed thereon is faced upward.

3. Wire Bonding Step (S103)

Subsequently, in a wire bonding step shown in FIG. 5, the pads formed over the surface of the semiconductor chip, and the leads disposed around the semiconductor chip are respectively electrically connected through a plurality of wires (conductive members).

In the wire bonding step, a wire bonding tool is used to bond one end portion of each wire comprised of a metal material such as gold (Au), copper (Cu) to the pad of the semiconductor chip and bond the other end of each wire to the lead (inner lead portion). As this bonding method, for example, a method for applying an ultrasonic wave to a junction part to form metal coupling, a method using thermocompression, a method using both the ultrasonic wave and the thermocompression, etc. exist.

4. Mold Step (S104)

Next, in a mold step shown in FIG. 5, the respective one parts of the semiconductor chip, wires, and leads are sealed by a resin to form a sealing body. Specifically, the semiconductor chip is sealed by a resin in such a manner that the lower surface of each lead is exposed, thereby to form a sealing body. That is, in the mold step, for example, a sealing body comprised of a resin is formed in each of a plurality of device areas formed in a lead frame to seal the entire semiconductor chip, the entire wires, and respective one parts (inner lead portions) of the leads are sealed by a resin.

5. Lead Cutting Step (Step S105)

Subsequently, in a lead cutting step shown in FIG. 5, the leads are respectively cut. The leads can be cut by press processing using a cutting die, for example.

6. Plating Step (S106)

Next, in a plating step shown in FIG. 5, the lead frame formed with the sealing body is injected into a plating solution (immersed). Thus, of the lead frame, a portion exposed from the sealing body is formed with a plating film (conductor film). Particularly, since the lower surface of each lead is exposed from the sealing body, the lower surface of the lead is also formed with the plating film. Thus, in the present embodiment, leakage of a solder material used in a subsequent mounting step (step of mounting a semiconductor device completed via the solder material over a mounting board) can be improved by forming a plating film over the lower surface of each lead exposed from the sealing body, so that a mounting strength can be secured. Incidentally, the plating film formed in the plating step in the present embodiment is made up of, for example, a solder material comprised principally of tin (Sn).

7. Dicing (Suspension Lead Cutting) Step (S107)

Subsequently, in a dicing step shown in FIG. 5, suspension leads for supporting the chip mounting section are cut to separate the device to be tested from the frame section of the lead frame. Thus, it is possible to obtain the device to be tested. A method for cutting the suspension leads can be carried out by, for example, press processing using the cutting die in a manner similar to the above-described lead cutting step.

Here, the device to be tested obtained by the dicing step is the same structure as the semiconductor device PKG1 shown in FIGS. 1 to 3. Since, however, the device to be tested obtained by the dicing step is in a state prior to the execution of the inspection step, the semiconductor device prior to its inspection will be described as the device to be tested in the present embodiment to distinguish the states of the semiconductor device before and after inspection. On the other hand, the post-inspection semiconductor device will be described as the semiconductor device PKG1.

8. Inspection Step (S108)

Next, in an inspection step shown in FIG. 5, for example, an electrical characteristic inspection of the device to be tested is carried out to select a non-defective product adapted to a prescribed evaluation reference. Further, the non-defective product, i.e., the semiconductor device PKG1 shown in FIGS. 1 to 3 is shipped and mounted onto the mounting board. On the other hand, a defective product non-adapted to the evaluation reference is subjected to correction treatment and discard treatment according to the contents of nonconformity.

In the inspection step for carrying out the electrical characteristic inspection of the device to be tested, after the device is set to an inspection jig, a contact pin is brought into contact with the lead of the device to make a large current to flow from the contact pin to the lead of the device. It has become clear that as a result of examinations of such an inspection step by the present inventors, there exists room for improvement on that in terms of improving the service life of the contact pin. Thus, the room for improvement existent in the inspection step will first be described. Thereafter, the technical idea in the present embodiment given a device for the room will be described.

<Room for Improvement Existent in Inspection Step>

For example, in the inspection step of the device to be tested, the contact pin comes into direct contact with the solder film formed in the surface of the lead. In this case, a failure in external appearance of the lead through which the large current is made to flow, and life shortening of the contact pin brought into contact with the lead are revealed. This mechanism will be described below.

Figure 6:
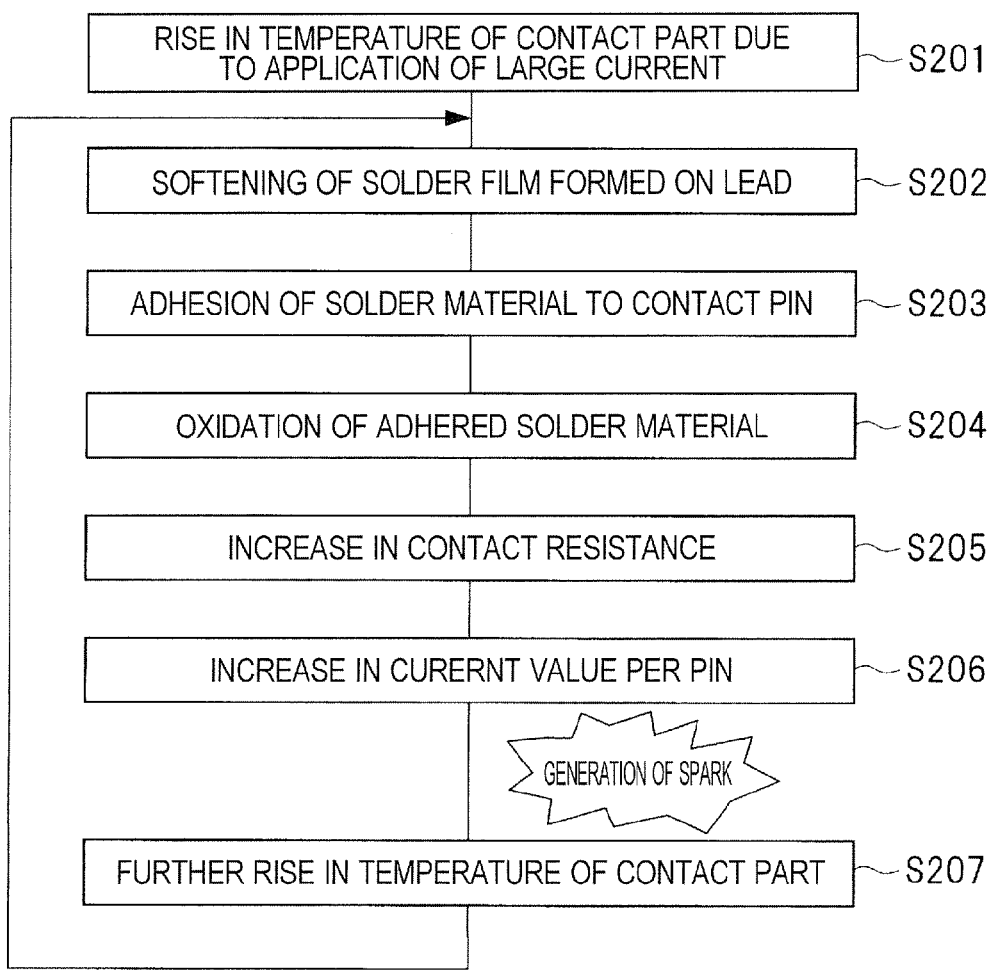
FIG. 6 is a flowchart for describing the mechanism in which a failure in external appearance of a lead and life shortening of a contact pin are caused.

FIG. 6 is a flowchart for describing the mechanism in which the failure in the external appearance of the lead and the life shortening of the contact pin are caused. First, as shown in FIG. 6, when a large current is made to flow between the lead and the contact pin, the temperature of a contact part between the lead and the contact pin rises due to the generation of Joule heat by causing the large current to flow (S201). Further, as the temperature of the contact part rises, the solder film formed over the lead is softened (S202), and a solder material is adhered to the contact pin (S203). Thereafter, the solder material attached to the contact pin is oxidized (S204). As a result, the resistance of contact between the lead and the contact pin increases (S205). At this time, a plurality of contact pins differ in the amount of adhesion of the solder material, and variations exist even in the oxidation state of solder. Therefore, variations exist in the contact resistance between the lead and the contact pin. As a result, the current preferentially flows in the contact pin low in the contact resistance. That is, the value of the current that flows per pin increases (S206). Thus, further, the temperature of the contact part between the lead and the contact pin rises (S207).

By repeating such a process, the solder film formed over the lead is melted, and the melted solder material is disposed by the contact pin brought into contact with the lead. When a contact pin having a plate spring structure is adopted in particular, the contact pin is flexed due to the load at pressure in the inspection step in addition to an increase in the contact area thereof with the lead and is slid over the surface (surface exposed from the sealing body) of the lead along the extending direction of the lead. Therefore, the amount of disposal of the melted solder material also increases. As a result, for example, the solder material is protruded from the lead to cause a so-called solder beard or residue, thus resulting in the occurrence of a failure in the external appearance of the lead. Further, for example, when the distance between adjacent leads becomes short with the miniaturization of the semiconductor device, the possibility that the adjacent leads are short-circuited via the solder beard also becomes large.

On the other hand, the solder material is adhered to the contact pin and the adhered solder material is oxidized, so that the surface of the contact pin becomes close to a state of being covered with an insulating film. Further, when the current made to flow through the contact pin increases in this state, the insulating film causes insulation breakdown and sparks are considered to be generated. With the generation of the sparks, the tip portion of the contact pin is estimated to disappear, and the service life of the contact pin is considered to be shorter.

It is understood from the above mechanism that in the inspection step of making the large current to flow, the failure in the external appearance of the device to be tested, and the life shortening of the socket terminal are easy to be revealed. From this point, the room for improvement exists in the inspection step of carrying the large current.

Here, in consideration of the above-described mechanism, for example, a contact pin having a plurality of projections is considered to be used in a part brought into contact with the lead of the device to be tested, in terms of suppressing the generation of Joule heat as much as possible even if the large current is made to flow. Thus, the current can be dispersed as compared with the case where the lead and the contact pin come into contact with each other only at one spot (one point). In other words, it is possible to reduce the value of the current which flows in one contact point, As a result, it is considered that the generation of sparks at the contact pin can be suppressed by the effect of current dispersion, thereby making it possible to secure the service life of the contact pin.

When, however, the projections are adopted for the contact pin having the so-called plate spring structure, it is necessary to sufficiently adjust the height of each projection. Specifically, in the inspection step using the contact pin having the plate spring structure, the contact pin is flexed.

That is, the tip portion of the contact pin is moved from the position before the lead comes into contact therewith by the load (vertical load) when the lead of the device to be tested is made contact with the contact pin. As a result, even if the contact pin is in a flexed state where the form of providing the tip portion of the contact pin with the projections is adopted, the height of each projection must be adjusted in such a manner that the projections reliably contact the lead of the device to be tested. That is, in the case of the structure in which the tip portion of the contact pin is provided with the projections, high processing accuracy is required to effectively achieve an improvement in the service life of the contact pin by the current dispersion while the current dispersion effect is expected. Therefore, the room for improvement exists from the viewpoint of easiness of manufacture.

Thus, the present embodiment is given a device for the above room for improvement. A description will be made below about the technical idea according to the present embodiment given this device.

Inspection Step in the Embodiment

Figure 7:
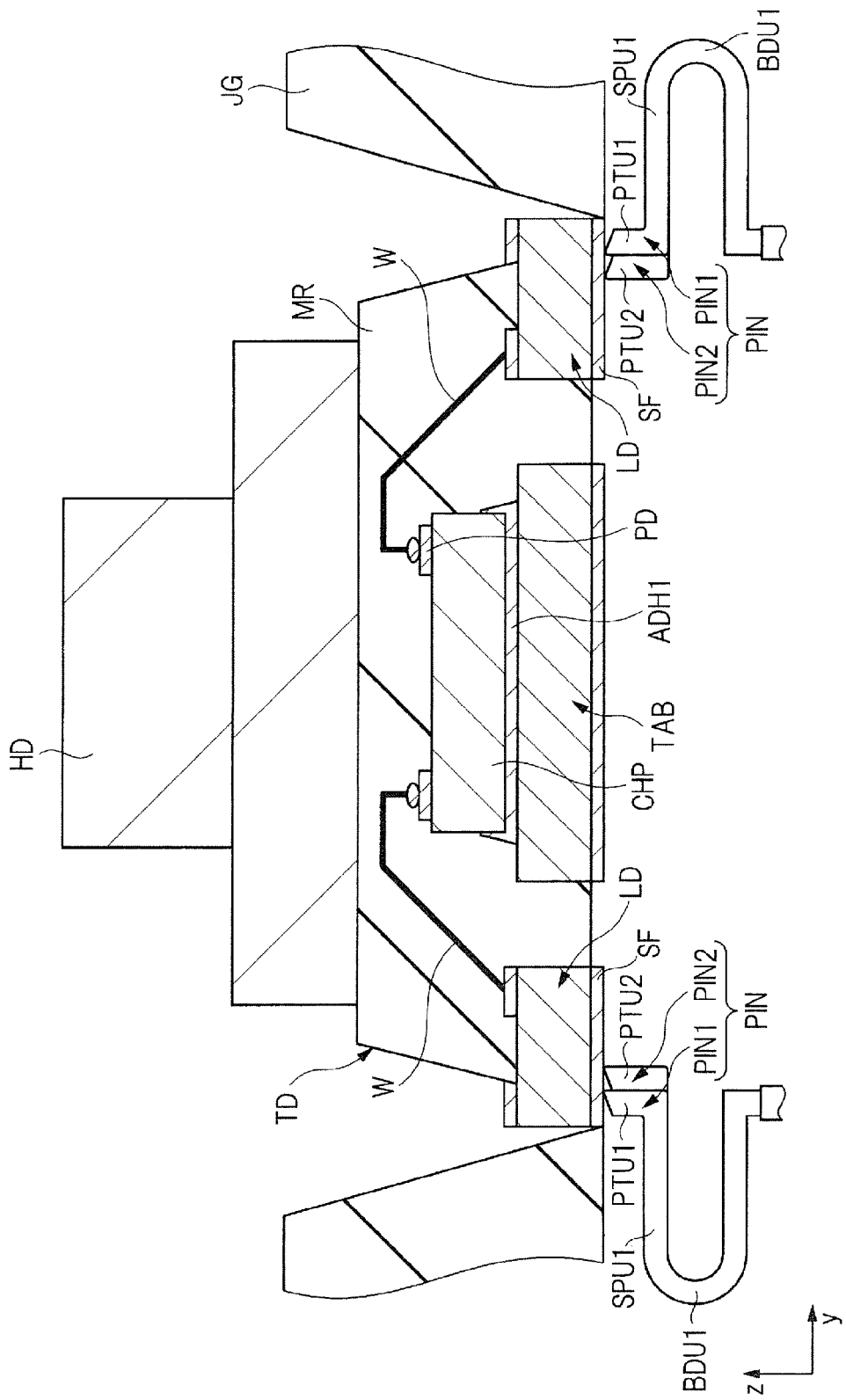
FIG. 7 is a diagram for describing an inspection step in the embodiment.

FIG. 7 is a diagram for describing the inspection step in the present embodiment. As shown in FIG. 7, in the inspection step in the present embodiment, a device TD to be tested is placed in a positioning jig JG by using a handler HD. Specifically, in FIG. 7, the lower surface of a lead LD is exposed from a sealing body MR comprised of a resin. The device TD to be tested is placed in the positioning jig JG in such a manner that a contact pin PIN comes into contact with the lower surface of the lead LD. That is, in the inspection step in the present embodiment, the device TD to be tested is set to the positioning jig JG and the contact pin PIN is brought into contact with the lower surface ("first surface") of the lead LD.

At this time, as shown in FIG. 7, the contact pin PIN brought into contact with one lead LD is comprised of a contact pin PIN1 and a contact pin PIN2. The contact pin PIN1 is comprised of a support portion SPU1 connected to a bent portion BDU1, and a tip portion PTU1 provided at the tip of the support portion SPU1. Likewise, although not shown in FIG. 7, the contact pin PIN2 also has a bent portion (not seen because of being overlapped with the bent portion BDU1) comprised of a structure similar to the bent portion BDU1 and is comprised of a support portion (not seen because of being overlapped with the support portion SPU1 in FIG. 7) connected to the bent portion, and a tip portion PTU2 provided at the tip of the support portion.

Further, the contact between the lead LD of the device TD to be tested and the contact pin PIN is realized by contact (first contact) between the lead LD and the tip portion PTU1 of the contact pin PIN1 and contact (second contact) between the lead LD and the tip portion PTU2 of the contact pin PIN2. That is, in the present embodiment, the contact between the lead LD of the device TD to be tested and the contact pin PIN assumes two-point contact. That is, in the inspection step in the present embodiment, the two-point contact between the lead LD of the device ID to be tested and the contact pin PIN is realized by using the contact pint PIN comprised of the pair of contact pins PIN1 and PIN2 each comprised of the bent portion, the support portion, and the tip portion, which are independent of each other.

Figure 8:
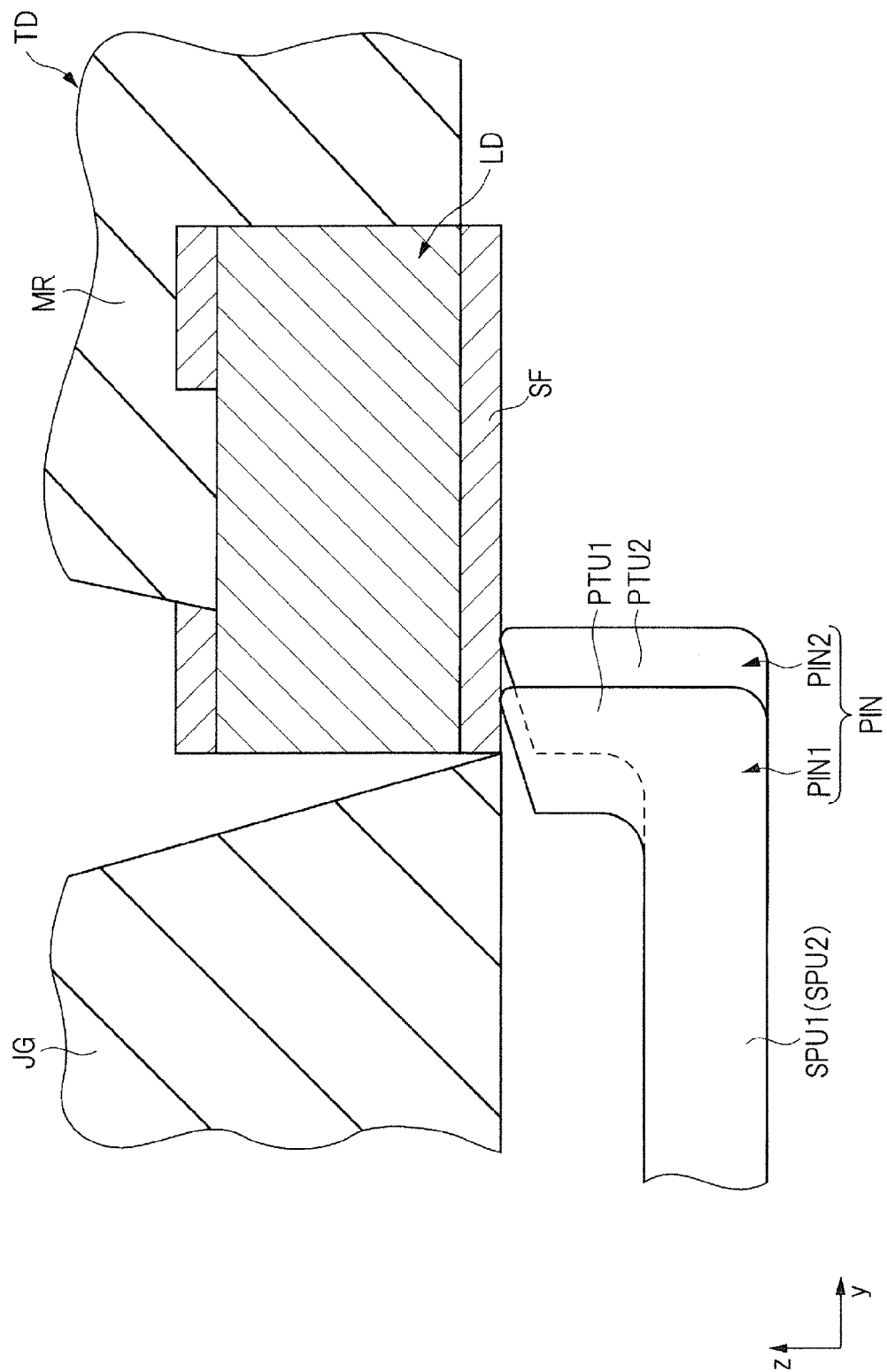
FIG. 8 is a diagram showing in an enlarged form, a coupling mode between a lead and a contact pin.

FIG. 8 is a diagram showing in an enlarged form, the coupling form between the lead LD and the contact pin PIN. As shown in FIG. 8, the lead LD exposed from the sealing body MR is in contact with the contact pin PIN peculiar to the present embodiment. Specifically, the contact pin PIN is provided with the pair of contact pin PIN1 and the contact pin PIN2. The tip portion PTU1 of the contact pin PIN1 and a solder film SF formed over the lower surface of the lead LD are in contact with each other at a first portion of the lead LD. Further, the tip portion PTU2 of the contact pin PIN2 and the solder film SF formed over the lead LD are in contact with each other at a second portion of the lead LD.

That is, in the present embodiment, the contact pin PIN includes the contact pin PIN1 having the tip portion PTU1 to be contacted with the first portion of the lead LD, and the contact pin PIN2 having the tip portion PTU2 to be contacted with the second portion of the lead LD. Further, the contact pin PIN1 has the support portion SPU1 and the tip portion PTU1 connected to the support portion SPU1, and the contact pin PIN2 has the support portion SPU2 and the tip portion PTU2 connected to the support portion SPU2. At this time, the support portion SPU1 of the contact pin PIN1 and the support portion SPU2 of the contact pin PIN2 are arranged side by side along an x direction (first direction) within a horizontal plane (xy plane). Further, the tip portion PTU2 of the contact pin PIN2 is shifted from the tip portion PTU1 of the contact pin PIN1 along a y direction (second direction) orthogonal to the x direction within the horizontal plane. Thus, in the present embodiment, the device TD to be tested is disposed in the positioning jig JG in such a manner that the lead LD and the contact pin PIN are brought into contact with each other. Incidentally, the above "horizontal plane" indicates a plane substantially parallel with the lower surface of the lead LD or the lower surface of the sealing body MR. Therefore, the "x direction within the horizontal plane" and the "y direction with the horizontal plane" both indicate the direction extending in the direction substantially parallel to the lower surface of the lead LD.

Figure 9:
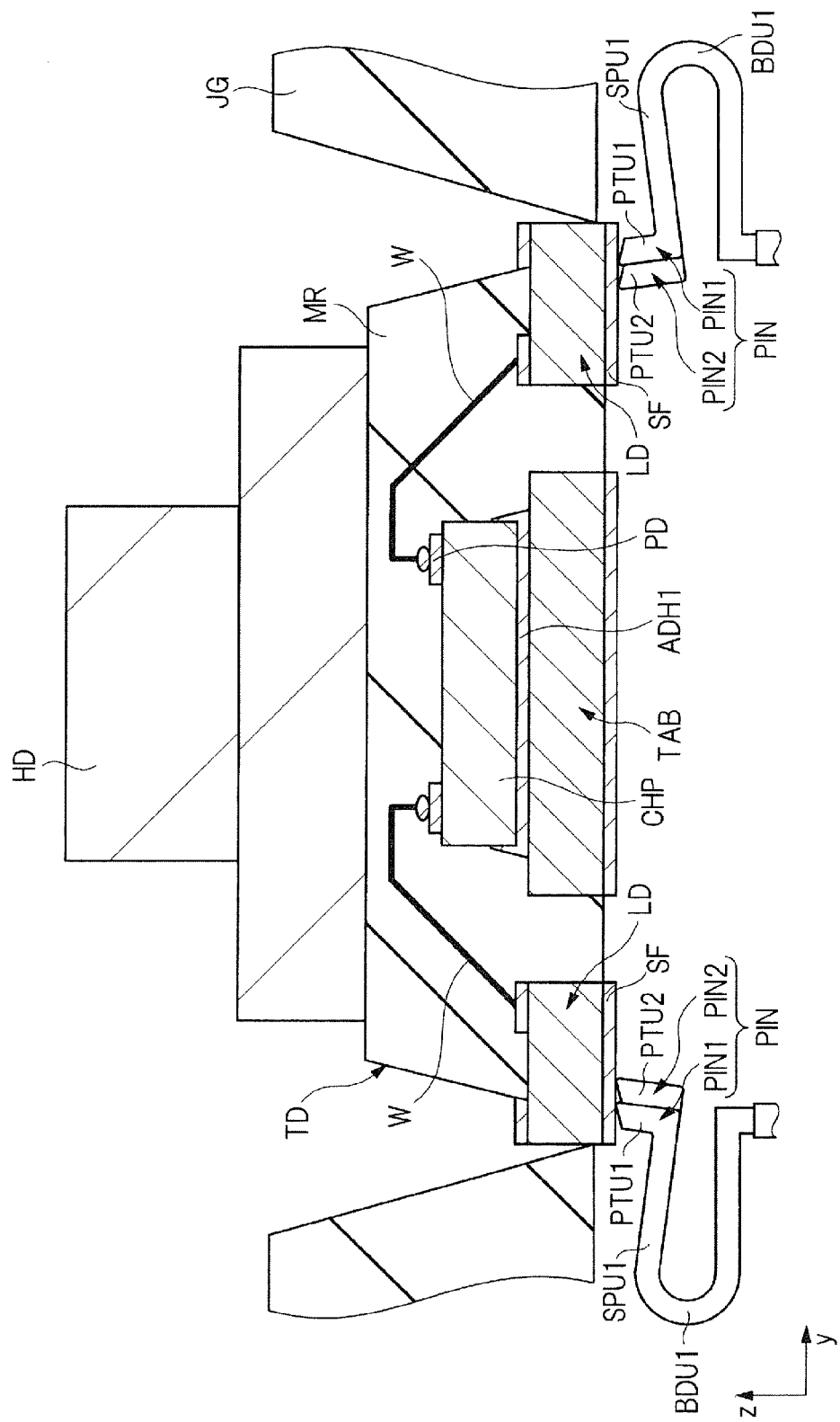
FIG. 9 is a sectional diagram showing a state in which a device to be tested is pressed.

Subsequently, FIG. 9 is a sectional diagram showing a state in which the device TD to be tested is being pressed. As shown in FIG. 9, in the inspection step in the present embodiment, for example, after the device TD to be tested is disposed in the positioning jig JG, a vertical load is applied to the device TD by using the handler HD to press the device TD. Consequently, the contact pin PIN1 and the contact pin PIN2 are respectively flexed so that the lead LD and the contact pin PIN1 are reliably brought into contact with each other, and the lead LD and the contact pin PIN2 are reliably brought into contact with each other.

At this time, in the present embodiment, as shown in FIG. 9, the curvature radius of the bent portion BDU1 connected to a portion on the side opposite to a portion to which the tip portion PTU1 is connected, of the support portion SPU1 of the contact pin PIN1, and the curvature radius of the bent portion (not seen because of being overlapped with the bent portion BDU1 in FIG. 9) connected to a portion on the side opposite to a portion to which the tip portion PTU2 is connected, of the support portion (not seen because of being overlapped with the support portion SPU1 in FIG. 9) of the contact pin PIN2 become equal to each other. Thus, according to the present embodiment, the state of flexure of the contact pin PIN1 and the state of flexure of the contact pin PIN2 can be made substantially similar to each other. As a result, according to the present embodiment, an adjustment (stroke control) to allow the contact pin PIN1 and the lead LD to contact each other, and an adjustment (stroke control) to allow the contact pin PIN2 and the lead LD to contact each other can be realized by a substantially similar adjustment method, thereby making it possible to achieve simplification of an adjustment technique.

Incidentally, the device TD to be tested has been pressed by using the handler HD in the present embodiment. When, however, the positioning jig JG is provided with a lid, for example, the device TD to be tested may be pressed using this lid.

FIG. 10 is a diagram showing in an enlarged form, the mode of coupling between the lead LD and the contact pin PIN at the time of pressure. As shown in FIG. 10, the contact pin PIN peculiar to the present embodiment is in contact with the lead LD exposed from the sealing body MR. In particular, the pair of contact pins PIN1 and PIN2 configuring the contact pin PIN is flexed by the vertical load at the pressure and slid over the exposed surface (lower surface) of the lead LD along the extending direction (y direction) of the lead LD. That is, after the contact pin PIN is made to contact with the lower surface of the lead LD, the tip portion PTU1 and the tip portion PTU2 are rubbed against the lower surface of the lead LD along the extending direction of the support portion SPU1 and the support portion SPU2. This operation will be referred to as wiping in the present specification. As a result, in the present embodiment, the lead LD and the contact pin PIN are brought into reliable contact. That is, after the device pressure, the tip portion PTU1 formed at the contact pin PIN1 and the tip portion PTU2 formed at the contact pin PIN2 are respectively brought into reliable contact with the solder film SF formed over the lower surface of the lead LD. That is, the tip portion PTU1 formed at the contact pin PIN1 and the tip portion PTU2 formed at the contact pin PIN2 are respectively brought into contact with the solder material lying inside the solder film SF by wiping without coming into contact with an oxide film formed in the surface of the solder film SF, thus making it possible to more reduce a resistance component at this contact part. Thus, in the inspection step in the embodiment, the reliable contact (low resistance contact) between the lead LD and the contact pin PIN can be realized by carrying out the wiping under the pressure of the device TD to be tested.

For example, the amount of wiping of the tip portion PTU1 of the contact pin PIN1 and the amount of wiping of the tip portion PTU2 of the contact pin PIN2 are both about 70 μm.

Thereafter, the current is made to flow into the lead LD through the contact pin PIN to thereby inspect the electrical characteristics of the device to be tested. The inspection step in the present embodiment is carried out in this manner. Here, for example, in the inspection step in the present embodiment, the value of a load applied to press the device TD to be tested is 65 g weight/pin. Further, when the device TD to be tested is a power semiconductor device, for example, a current of 50 A is made to flow into a source terminal of the device TD to carry out the inspection of the electrical characteristics of the device TD. At this time, for example, assuming that the source terminal of the device TD is made up of three leads LD, the value of a current made to flow through one lead LD becomes about 17 A. Further, since the two contact pins (contact pin PIN1 and contact pin PIN2) are configured so as to contact one lead LD in the inspection step in the present embodiment, the values of the currents respectively flowing through the contact pin PIN1 and the contact pin PIN2 become about 8.5 A. Thus, according to the inspection step in the present embodiment, it is understood that the values of the currents flowing through the contact pins can be dispersed.

Features in the Embodiment

Feature points in the present embodiment will next be described. FIG. 11 is a typical diagram showing the configuration of the contact pin PIN used in the inspection step in the present embodiment. In particular, FIG. 11A is a top view showing the configuration of the contact pin PIN, and FIG. 11B is a side view as seen from the direction indicated by an arrow in FIG. 11A.

Figure 11A:
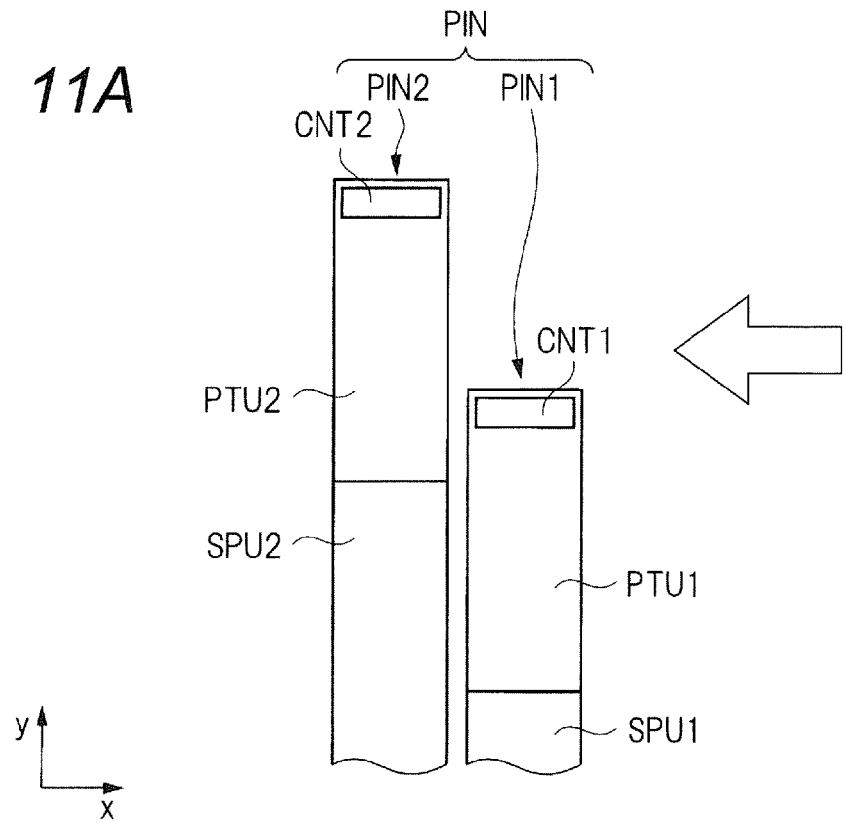
FIG. 11A is a top view showing the configuration of the contact pin.
Figure 11B:
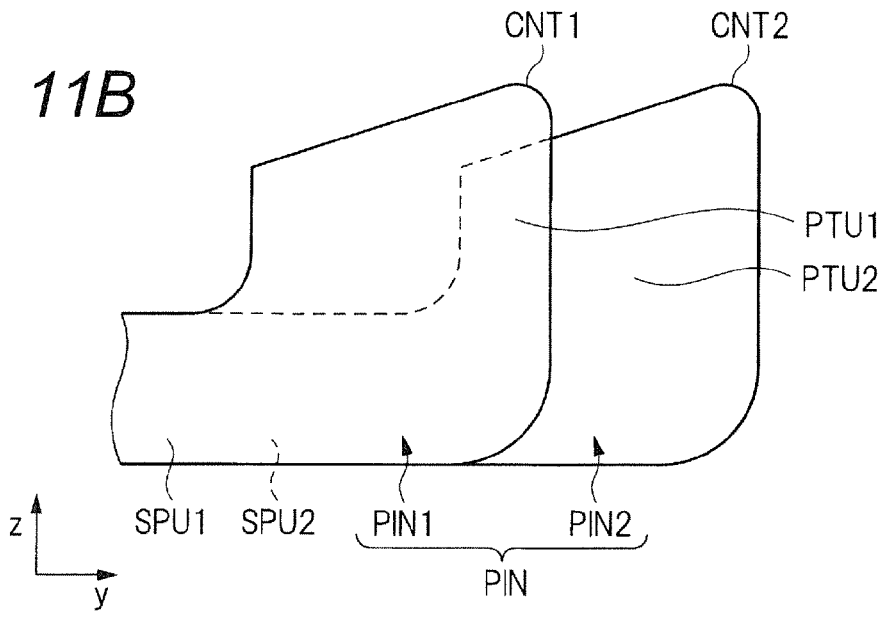
FIG. 11B is a side view as viewed from the direction indicated by an arrow in FIG. 11A.

First, as shown in FIG. 11A, the contact pin PIN in the present embodiment is provided with the contact pin PIN1 and the contact pin PIN2. Further, the contact pin PIN1 has the support portion SPU1 extending in the y direction and the tip portion PTU1 connected to the support portion SPU1. A contact part CNT1 is formed at part of the tip portion PTU1. Likewise, the contact pin PIN2 has the support portion SPU2 extending in the y direction and the tip portion PTU2 connected to the support portion SPU2. A contact part CNT2 is formed at part of the tip portion PTU2.

Here, the support portion SPU1 of the contact pin PIN1 and the support portion SPU2 of the contact pin PIN2 are arranged side by side along the x direction within the horizontal plane (xy plane). And the tip portion PTU2 of the contact pin PIN2 is shifted from the tip portion PTU1 of the contact pin PIN1 along the y direction in the horizontal plane crossing (perpendicular to) the x direction. That is, the direction in which the tip portion PTU2 of the contact pin PIN2 is shifted from the tip portion PTU1 of the contact pin PIN1 corresponds to the direction in which the support portion SPU1 of the contact pin PIN1 and the support portion SPU2 of the contact pin PIN2 extend. In this case, for example, assuming that the planar shape of the lead which allows the contact pin PIN1 and the contact pin PIN2 to contact is rectangular, the tip portion PTU2 of the contact pin PIN2 and the tip portion PTU1 of the contact pin PIN1 can be shifted along the long side direction of the rectangle by aligning the extending direction of the support portions SPU1 and SPU2 with the long side direction of the rectangle. It is therefore possible to obtain an advantage that it becomes easy to secure the amount of shifting.

Further, in the contact pin PIN1 and the contact pin PIN2 in the present embodiment, the length in the extending direction (y direction) of the support portion SPU1 of the contact pin PIN1, and the length in the extending direction (y direction) of the support portion SPU2 of the contact pin PIN2 are different from each other.

For example, the tip portion PTU2 of the contact pin PIN2 is considered to be capable of being shifted with respect to the tip portion PTU1 of the contact pin PIN1 by moving the contact pin PIN2 in parallel to the contact pin PIN1 while using the contact pin PIN1 and the contact pin PIN2 equal to each other in shape (length, width). In this case, however, it is necessary to secure an arrangement space greater than the size of the contact pin PIN1 (PIN2) of the same shape by movement of the contact pin PIN2 in parallel to the contact pin PIN1. It becomes difficult to achieve miniaturization of an inspection apparatus.

On the other hand, in the present embodiment, the tip portion PTU2 of the contact pin PIN2 is shifted with respect to the tip portion PTU1 of the contact pin PIN1 by allowing the length in the extending direction (y direction) of the support portion SPU1 of the contact pin PIN1 and the length in the extending direction (y direction) of the support portion SPU2 of the contact pin PIN2 to differ from each other. This configuration can be realized by, for example, making the length in the extending direction (y direction) of the support portion SPU1 of the contact pin PIN1 shorter than the length in the extending direction (y direction) of the support portion SPU2 of the contact pin PIN2. As a result, according to the present embodiment, the arrangement space within which the length in the extending direction (y direction) of the support portion SPU2 of the contact pin PIN2 falls may be secured. Thus, there can be obtained an advantage that it is possible to achieve space saving of the inspection apparatus.

Further, as shown in FIG. 11A, the pair of contact pins PIN1 and PIN2 configuring the contact pin PIN in the present embodiment is comprised of components (support portions and tip portions) independent of one another. The support portion SPU1 of the contact pin PIN1 and the support portion SPU2 of the contact pin PIN2 are arranged so as to be spaced away from each other in the x direction.

Subsequently, as shown in FIG. 11B, the support portion SPU1 and the tip portion PTU1 are formed integrally in the contact pin PIN1. Of the tip portion PTU1, an area high in height in the z direction functions as the contact part CNT1. Likewise, the support portion SPU2 and the tip portion PTU2 are formed integrally in the contact pin PIN2. Of the tip portion PTU2, an area high in height in the z direction functions as the contact part CNT2. Further, as shown in FIG. 11B, the height (z direction) of the support portion SPU1 of the contact pin PIN1 is equal to the height of the support portion SPU2 of the contact pin PIN2. That is, the position of the support portion SPU1 of the contact pin PIN1 in the z direction intersecting with (orthogonal to) the lower surface (xy plane) of the sealing body is equal to the position of the support portion SPU2 of the contact pin PIN2 in the z direction intersecting with (orthogonal to) the lower surface (xy plane) of the sealing body. Further, as shown in FIG. 11B, the shape of the tip portion PTU1 of the contact pin PIN1 and the shape of the tip portion PTU2 of the contact pin PIN2 are equal to each other, and the height (z direction) of the tip portion PTU1 of the contact pin PIN1 and the height (z direction) of the tip portion PTU2 of the contact pin PIN2 become equal to each other. That is, the position of the tip portion PTU1 of the contact pin PIN1 in the z direction intersecting with (orthogonal to) the lower surface (xy plane) of the sealing body is equal to the position of the tip portion PTU2 of the contact pin PIN2 in the z direction intersecting with (orthogonal to) the lower surface (xy plane) of the sealing body.

Here, the feature points in the present embodiment reside in that assuming that the contact pin PIN is comprised of the pair of contact pins PIN1 and PIN2 independent of each other, the support portion SPU1 and the support portion SPU2 are arranged side by side along the x direction in the horizontal plane, and the tip portion PTU2 is arranged so as to be shifted from the tip portion PTU1 along the y direction in the horizontal plane. Thus, according to the present embodiment, the contact pin PIN is first comprised of the pair of contact pins PIN1 and PIN2 independent of each other to thereby enable the currents flowing through the pair of contact pins PIN1 and PIN2 to be dispersed. Thus, it is possible to suppress the generation of sparks in the contact pin PIN. This is because it is considered that as can be understood even from the mechanism shown in FIG. 6, the generation of Joule heat at the contact part increases as the value of the current made to flow becomes larger, thereby to increase the amount of adhesion of the solder material softened by the Joule heat to the contact pin PIN, thus resulting in an increase in the resistance value due to the oxidation of the solder material and thereby causing manifestation of the generation of the sparks at the contact pin PIN. In other words, it is considered that if the currents can be dispersed, the generation of the Joule heat can be suppressed to thereby reduce the amount of adhesion of the solder material to the contact pin PIN, thus resulting in making it hard to cause an increase in the resistance value due to the oxidation of the solder material and thereby making it possible to suppress the generation of the sparks at the contact pin PIN.

Further, in the present embodiment, the tip portion PTU2 of the contact pin PIN2 is disposed so as to be shifted from the tip portion PTU1 of the contact pin PIN1 along the y direction in the horizontal plane to thereby enable the generation of the sparks at the contact pin PIN to be further suppressed, whereby the service life of the contact pin PIN can be secured.

This point will be described below. In the inspection step in the present embodiment, the contact pin PIN is brought into contact with the lead LD of the device TD to be tested as described in FIGS. 7 to 10, and thereafter the wiping operation is performed on the contact pin PIN. Thus, according to the present embodiment, it is possible to improve the reliability of contact between the lead LD and the contact pin PIN. At this time, since the contact pin PIN is slid with respect to the lead LD formed with the solder film SF while being rubbed thereagainst after the contact of the contact pin PIN with the lead LD during the wiping operation, the solder material is adhered to the contact pin PIN.

At this time, the currents respectively flowing through the pair of contact pins PIN1 and PIN2 can be dispersed by configuring the contact pin PIN from the pair of contact pins PIN1 and PIN2 independent of each other. When, however, the tip portion PTU2 of the contact pin PIN2 and the tip portion PTU1 of the contact pin PIN1 are not arranged shifted from each other, inconvenience to be shown below occurs.

That is, the greater the number of executions of the inspection step, the larger the amount of the solder material adhered to the tip portion PTU1 of the contact pin PIN1 and the amount of the solder material adhered to the tip portion PTU2 of the contact pin PIN2. As a result, it is considered that even if the contact pin PIN is comprised of the pair of contact pins PIN1 and PIN2 independent of each other, the solder material adhered to the tip portion PTU1 and the solder material adhered to the tip portion PTU2 are connected to each other where the tip portion PTU2 of the contact pin PIN2 and the tip portion PTU1 of the contact pin PIN1 are not arranged shifted from each other. In this case, even if the contact pin PIN is comprised of the pair of contact pins PIN1 and PIN2 independent of each other, the effect of current dispersion by the contact pin PIN1 and the contact pin PIN2 will disappear due to a solder bridge by the solder material. In other words, the current is concentrated on the solder bridge to generate large Joule heat. Thus, sparks become easy to be generated in the solder bridge by the mechanism shown in FIG. 6, so that the service life of the contact pin PIN is shortened. That is, it is considered that when the tip portion PTU2 of the contact pin PIN2 and the tip portion PTU1 of the contact pin PIN1 are not arranged shifted from each other even if the contact pin PIN is comprised of the pair of contact pins PIN1 and PIN2 independent of each other, the solder bridge is easier to occur, and the achievement of a long life of the contact pin PIN becomes difficult due to the sparks.

On the other hand, in the present embodiment, as shown in FIGS. 11A and 11B, the contact pin PIN is comprised of the pair of contact pins PIN1 and PIN2 independent of each other, and the tip portion PTU1 of the contact pin PIN1 and the tip portion PTU2 of the contact pin PIN2 are arranged so as to be shifted along the y direction in the horizontal plane. Thus, according to the present embodiment, the generation of the sparks at the contact pin PIN can be suppressed and thereby the service life of the contact pin PIN can be secured.

Figure 12A:
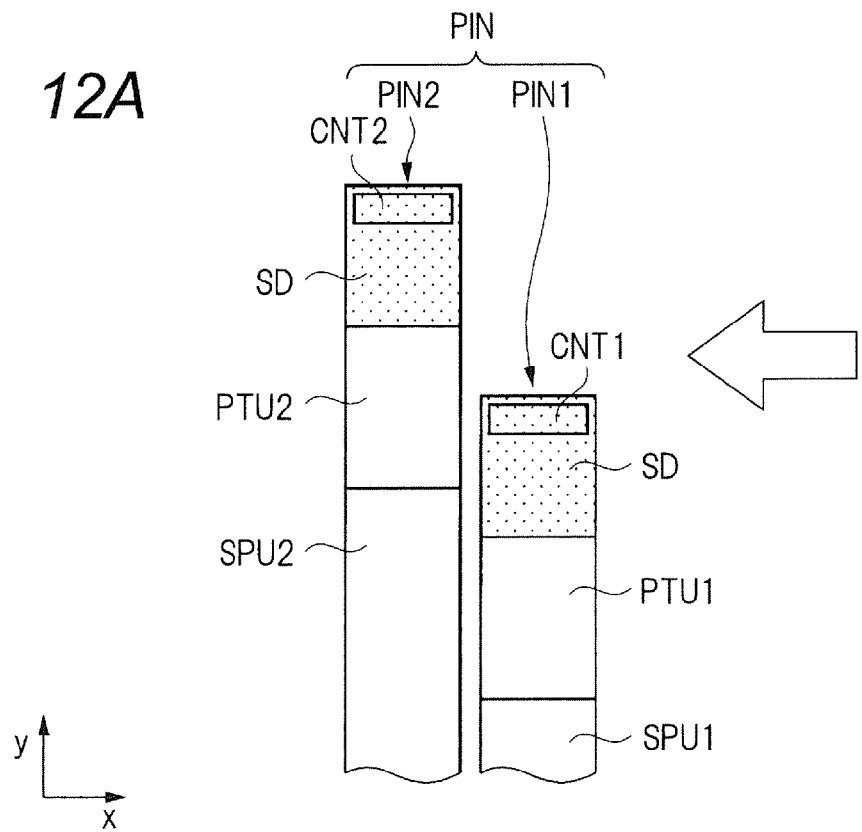
FIG. 12A is a top view showing a state in which the inspection step in the embodiment is carried out plural times to thereby adhere a solder material to the contact pin.
Figure 12B:
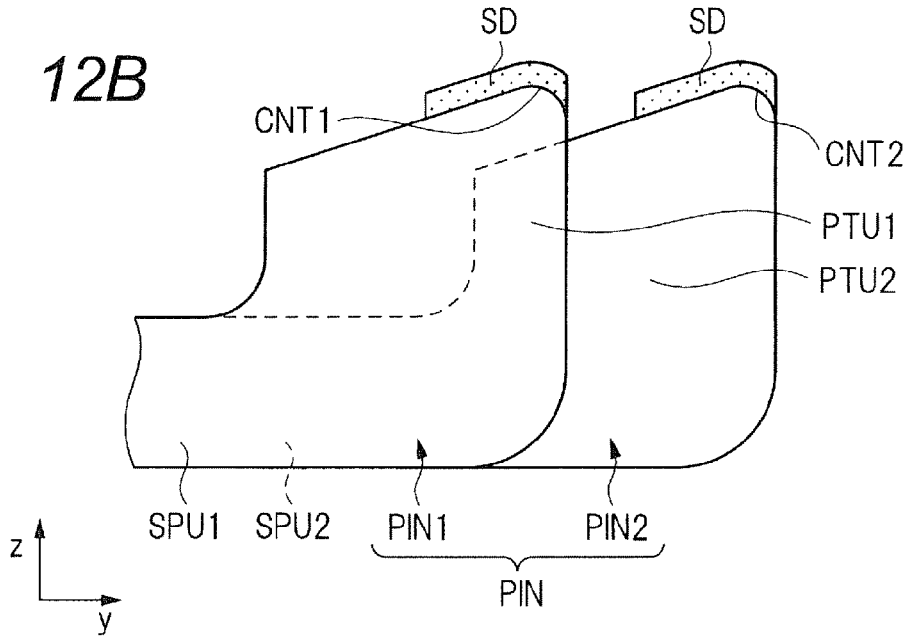
FIG. 12B is a side view as viewed from the direction indicated by an arrow in FIG. 12A.

Specifically, FIG. 12A is a top view showing a state in which a solder material SD is adhered to the contact pin PIN by carrying out the inspection step in the present embodiment many times. FIG. 12B is a side view as seen from the direction indicated by an arrow in FIG. 12A. It is understood that in FIGS. 12A and 12B, the solder material SD is adhered to the periphery of the contact part CNT1 of the tip portion PTU1 formed at the contact pin PIN1, and the solder material SD is adhered to the periphery of the contact part CNT2 of the tip portion PTU2 formed at the contact pin PIN2.

At this time, in the present embodiment, the tip portion PTU1 of the contact pin PIN1 and the tip portion PTU2 of the contact pin PIN2 are arranged so as to be shifted along the y direction in the horizontal plane (xy plane). Therefore, as can be seen from FIGS. 12A and 12B, the position of adhesion of the solder material SD to the tip portion PTU1 of the contact pin PIN1 and the position of adhesion of the solder material SD to the tip portion PTU2 of the contact pin PIN2 are shifted from each other. This means that the solder material SD adhered to the contact pin PIN1 and the solder material SD adhered to the contact pin PIN2 are hard to be connected to each other. Thus, according to the present embodiment, it becomes hard to cause the solder bridge between the contact pin PIN1 and the contact pin PIN2. That is, in the present embodiment, since the solder bridge between the contact pin PIN1 and the contact pin PIN2 is suppressed even if the inspection step is carried out many times, the current dispersion effect by configuring the contact pin PIN from the pair of contact pins PIN1 and PIN2 can be maintained even after the inspection step is carried out many times. Even from this point, according to the present embodiment, the potential for generation of the sparks at the contact pin PIN can be reduced even if the inspection step is carried out plural times. As a result, the life prolongation of the contact pin PIN can be achieved.

According to the present embodiment as described above, since the tip portion PTU1 of the contact pin PIN1 and the tip portion PTU2 of the contact pin PIN2 are arranged so as to be shifted along the y direction in the horizontal plane (xy plane), the effect of making it harder to cause the solder bridge can be obtained even if the inspection step is carried out many times, as compared with the case where they are not arranged shifted from each other. Thus, if the tip portion PTU1 of the contact pin PIN1 and the tip portion PTU2 of the contact pin PIN2 are arranged shifted along the y direction in the horizontal plane (xy plane), a constant effect that it contributes to the life prolongation of the contact pin PIN can be obtained. However, in terms of the fact that the solder bridge between the tip portion PTU1 and the tip portion PTU2 is effectively suppressed to achieve further life prolongation of the contact pin PIN, the amounts of y-direction shifting of the tip portion PTU1 of the contact pin PIN1 and the tip portion PTU2 of the contact pin PIN2 are desirable to be twice the wiping amount of the wiping operation. A description will be made below about this reason.

Figure 13:
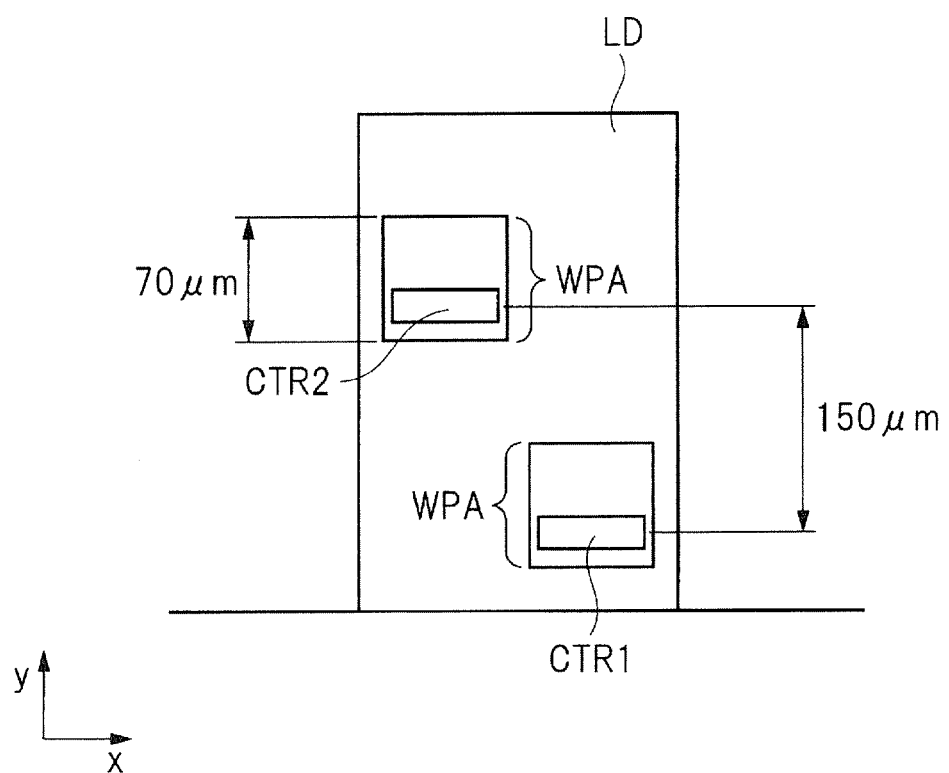
FIG. 13 is a diagram showing an area AR of FIG. 2 in an enlarged form.

FIG. 13 is a diagram showing the area AR of FIG. 2 in an enlarged form. Specifically, in FIG. 13, the lower surface of one lead LD is shown in an enlarged form. In FIG. 13, the inspection step is carried out while bringing the contact pin PIN peculiar to the present embodiment shown in FIG. 11 into contact with the lower surface of the lead LD, so that such traces as shown in FIG. 13 are formed in the lower surface of the lead LD. That is, in FIG. 13, the contact part CNT1 formed at the tip portion PTU1 of the contact pin PIN1 shown in FIG. 11 is brought into contact, so that a trace (contact area CTR1) of contact of the contact part CNT1 of the contact pin PIN1 is formed in the lower surface of the lead LD. Further, since the contact pin PIN1 is subjected to wiping, a trace is left even in an area equivalent to a wiping amount WPA. Likewise, the contact part CNT2 formed at the tip portion PTU2 of the contact pin PIN2 shown in FIG. 11 is brought into contact, so that a trace (contact area CTR2) of contact of the contact part CNT2 of the contact pin PIN2 is formed in the lower surface of the lead LD. Further, since the contact pin PIN2 is subjected to wiping, a trace is left even in an area equivalent to a wiping amount WPA.

Now, it is considered that the solder material SD is adhered mainly from the contact part CNT1 to the tip portion PTU1 of the contact pin PIN1 shown in FIG. 12 within the range of the wiping amount, and the solder material SD is adhered mainly from the contact part CNT2 even to the tip portion PTU2 of the contact pin PIN2 shown in FIG. 12 within the range of the wiping amount. Thus, it is considered that when the distance between the contact part CNT1 of the contact pin PIN1 and the contact part CNT2 of the contact pin PIN2 is separated by twice or more the wiping amount WPA in FIG. 13, the solder bridge becomes hard to occur between the solder material SD adhered to the contact pin PIN1 and the solder material SD adhered to the contact pin PIN2. That is, it is considered that when the amounts of shifting in the y direction of the tip portion PTU1 of the contact pin PIN1 and the tip portion PTU2 of the contact pin PIN2 are twice or more the wiping amount of the wiping operation, the solder bridge between the tip portion PTU1 and the tip portion PTU2 can effectively be suppressed. In this case, when the wiping amount WPA is assumed to be about 70 µm in FIG. 13, the distance in the y direction between the trace (contact area CTR1) at which the contact part CNT1 of the contact pin PIN1 is brought into contact, and the trace (contact area CTR2) at which the contact part CNT2 of the contact pin PIN2 is brought into contact becomes about 150 µm.

Incidentally, it is desirable that the amounts of shifting in the y direction of the tip portion PTU1 of the contact pin PIN1 and the tip portion PTU2 of the contact pin PIN2 are made large in terms of the fact that the solder bridge between the tip portion PTU1 and the tip portion PTU2 is effectively suppressed to achieve further life prolongation of the contact pin PIN. However, in order to bring both of the contact pin PIN1 and the contact pin PIN2 into contact with the lead LD, there is a need to include both of the contact part CNT1 and the contact part CNT2 in the lead LD in plan view. Therefore, the maximum value of each of the amounts of y-direction shifting of the tip portion PTU1 and the tip portion PTU2 is defined from this point of view.

Subsequently, of the feature points in the present embodiment, attention is paid to a point at which the contact pin PIN is configured of the pair of contact pins PIN1 and PIN2 independent of each other. An advantage brought about by this configuration will be described.

For example, it is considered that in order to achieve current dispersion at the contact pin, the tip portion of one contact pin is provided with a plurality of projections, and the projections are brought into multipoint contact with a lead. In the case of this configuration, however, the heights of the projections must be adjusted in consideration of the flexure of the contact pin to reliably bring the projections into contact with the lead even if the contact pin is flexed by wiping. Further, it is considered that even if the adjustments in the heights of the projections are satisfactorily made, it is difficult to stably bring the projections into contact with the lead when considering manufacture dispersion. That is, in the configuration that the tip portion of the one contact pin is provided with the projections, and the projections are brought into multipoint contact with the lead, there is a need to consider the adjustment in the height of each projection and its manufacture dispersion in order to effectively realize a current dispersion effect. A problem arises in terms of easiness of the manufacture of the contact pin.

On the other hand, in the present embodiment, the contact pin PIN is comprised of the pair of contact pins PIN1 and PIN2 independent of each other as shown in FIG. 11 without adopting the configuration that the tip portion of the one contact pin is provided with the projections. In this case, it becomes easy to adjust the height between the tip portion PTU1 of the contact pin PIN1 and the tip portion PTU2 of the contact pin PIN2. That is, since the tip portion PTU1 and the tip portion PTU2 are components independent of each other, the tip portion PTU1 and the tip portion PTU2 are not required to perform accurate height adjustment depending on their mutual arranged positions. As a result, according to the present embodiment, there can be obtained a remarkable effect that the reliable multipoint contact can be realized by configuring the contact pin PIN from the pair of contact pins PIN1 and PIN2 independent of each other, while improving easiness of manufacture of the contact pin PIN and easiness of adjustment in the contact pin PIN.

Further, there can be obtained advantages shown below by, of the feature points in the present embodiment, the point that assuming that the contact pin PIN is comprised of the pair of contact pins PIN1 and PIN2 independent of each other, the support portion SPU1 and the support portion SPU2 are arranged side by side along the x direction in the horizontal plane.

For example, FIG. 14 is a typical diagram showing the configuration of a related art in which a support portion SPU1 and a support portion SPU2 are arranged side by side along the vertical direction (z direction). As shown in FIG. 14, in the related art, a way of flexing the support portion SPU1 and a way of flexing the support portion SPU2 differ from each other as a result of arranging the support portion SPU1 and the support portion SPU2 side by side along the vertical direction (z direction). That is, in the related art, the stroke of the support portion SPU1 and the stroke of the support portion SPU2 are different from each other due to the fact that the support portion SPU1 and the support portion SPU2 are different in configuration. Thus, although the contact pin PIN is comprised of the pair of contact pins PIN1 and PIN2 independent of each other in the related art, it becomes difficult to improve the reliability of contact between the contact pin PIN1 and the lead LD and improve even the reliability of contact between the contact pin PIN2 and the lead LD simultaneously. Further, an adjustment method (stroke control method) for contacting the contact pin PIN1 with the lead LD, and an adjustment method (stroke control method) for contacting the contact pin PIN2 with the lead LD are different from each other. The adjustment methods are also complicated.

On the other hand, in the present embodiment, as shown in FIGS. 11A and 11B, for example, the support portion SPU1 and the support portion SPU2 are arranged side by side along the x direction in the horizontal plane assuming that the contact pin PIN is comprised of the pair of contact pins PIN1 and PIN2 independent of each other. In this case, unlike the related art, the shape of the contact pin PIN1 and the shape of the contact pin PIN2 can be made substantially similar to each other. Specifically, the shape of the tip portion PTU1 of the contact pin PIN1 and the shape of the tip portion PTU2 of the contact pin PIN2 are made similar to each other. Further, the support portion SPU1 and the support portion SPU2 are also different in length by the amount of shifting but are the same in height, and are realized with a substantially similar configuration. From this point, according to the present embodiment, there can be obtained an advantage that it becomes easy to improve the reliability of contact between the contact pin PIN1 and the lead LD and improve even the reliability of contact between the contact pin PIN2 and the lead LD simultaneously as compared with the related art.

Further, according to the present embodiment, there can also be obtained an advantage that since the adjustment (stroke control) for contacting the contact pin PIN1 with the lead LD and the adjustment (stroke control) for contacting the contact pin PIN2 with the lead LD can be realized by substantially the same adjustment method, it is possible to simplify an adjustment technique.

Also in the related art, the space in the z direction occupied by the contact pin PIN becomes large as a result of arranging the support portion SPU1 and the support portion SPU2 side by side along the vertical direction (z direction) as shown in FIG. 14. On the other hand, in the present embodiment, there can be obtained an advantage that since the support portion SPU1 and the support portion SPU2 are arranged side by side along the x direction in the horizontal plane, the space in the z direction occupied by the contact pin PIN can be made small.

From the above, according to the feature points in the present embodiment, the potential for the generation of the sparks at the contact pin PIN can be reduced even if the inspection step is carried out many times. As a result, the life prolongation of the contact pin PIN can be achieved. Further, according to the feature points in the present embodiment, there can be an excellent effect that space saving of the contact pin PIN can also be realized while improving easiness of manufacture of the contact pin PIN sand easiness of the adjustment therein. That is, it is understood that the technical idea in the present embodiment is an extremely profitable technical idea in that the life prolongation of the contact pin PIN can be achieved while realizing easiness of manufacture of the contact pin PIN and easiness of its adjustment and exhibiting the current dispersion effect by the reliable multipoint contact, and miniaturization of the contact pin PIN can be also be achieved.

Although the invention made above by the present inventors has been described specifically on the basis of the embodiment, the present invention is not limited to the embodiments referred to above. It is needless to say that various changes can be made thereto within the scope not departing from the gist thereof.

Modification 1

Figure 15A:
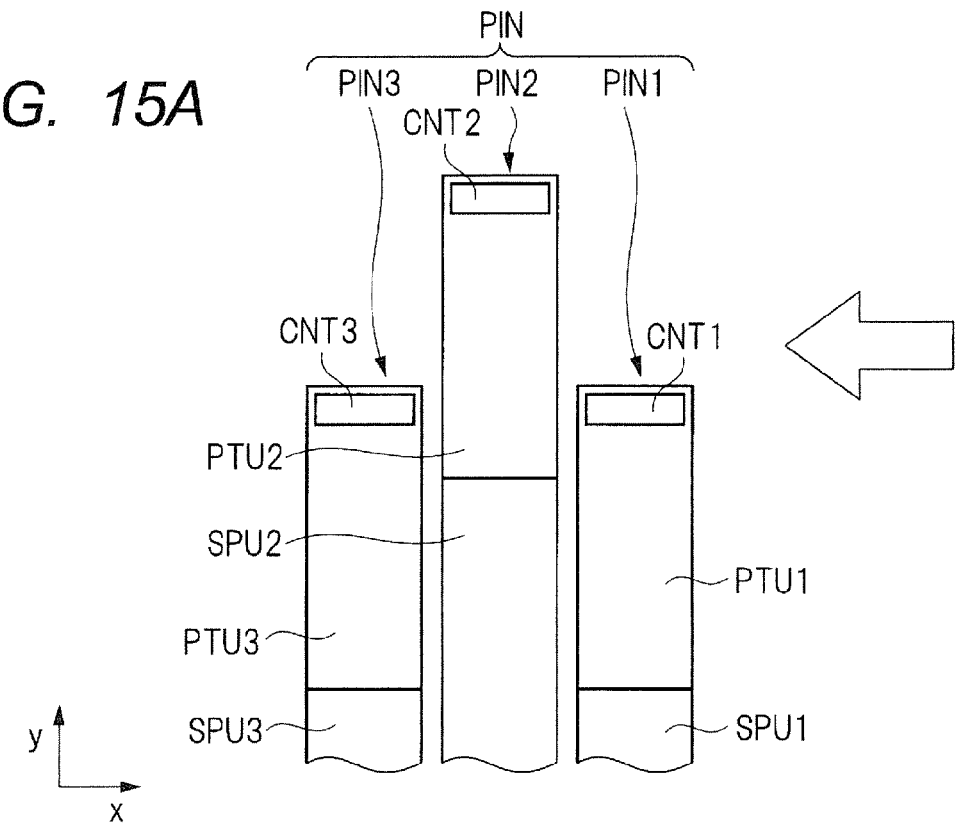
FIG. 15A is a plan diagram showing the configuration of a contact pin in a modification 1.
Figure 15B:
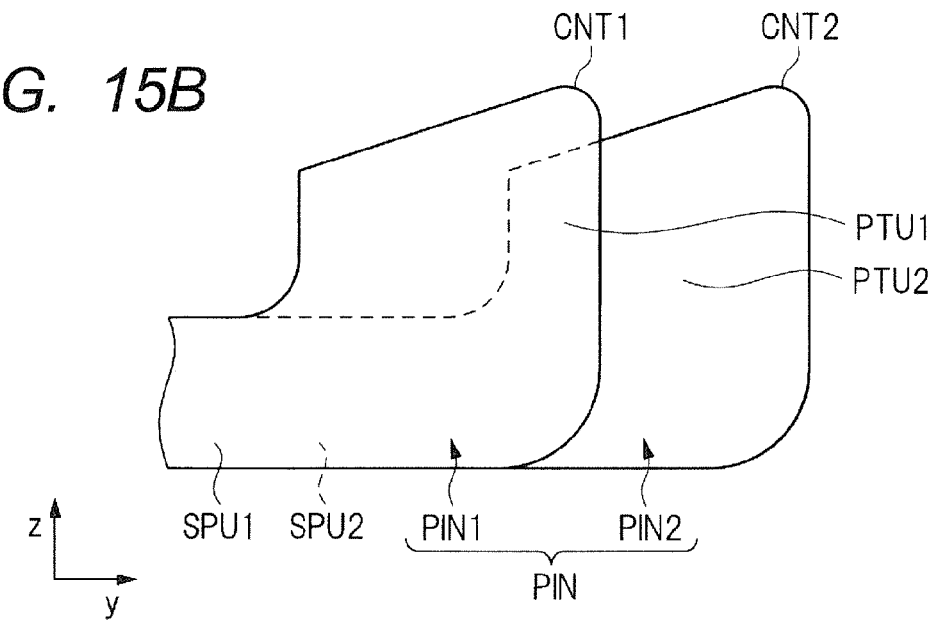
FIG. 15B is a side view as viewed from the direction indicated by an arrow in FIG. 15A.

In the present modification 1, a description will be made about an example in which a contact pin PIN is comprised of three contact pins PIN1, PIN2, and PIN3. FIG. 15A is a plan diagram showing the configuration of the contact pin PIN in the present modification 1. FIG. 15B is a side view as seen from the direction indicated by an arrow in FIG. 15A. As shown in FIG. 15, the contact pin PIN is comprised of the contact pins PIN1 to PIN3 independent of each other. Specifically, in addition to the configuration of the above embodiment, the contact pin PIN in the present modification 1 further includes the contact pin PIN3 provided with a tip portion PTU3 to be contacted with a third part of a lead. The contact pin PIN3 has a support portion SPU3 and a tip portion PTU3 connected to the support portion SPU3. Further, a contact part CNT3 high in height is provided at part of the tip portion PTU3.

Here, as shown in FIG. 15A, the support portion SPU1 of the contact pin PIN1, the support portion SPU2 of the contact pin PIN2, and the support portion SPU3 of the contact pin PIN3 are arranged side by side along the x direction (first direction) in the horizontal plane (xy plane). Further, the tip portion PTU3 of the contact pin PIN3 is shifted from the tip portion PTU2 of the contact pin PIN2 along the y direction in the horizontal plane, which intersects with the x direction.

However, as shown in FIG. 15A, the tip portion PTU1 of the contact pin PIN1 and the tip portion PTU3 of the contact pin PIN3 are identical in position as viewed in the y direction. From this point, the contact pin PIN3 is not visible due to being hidden by the contact pin PIN2 in FIG. 15B, for example. As described above, the tip portion PTU1, the tip portion PTU2, and the tip portion PTU3 are arranged in a zigzag layout.

Thus, even in the present modification 1, the generation of sparks at the contact pin PIN can be suppressed. As a result, the service life of the contact pin PIN can be secured.

Figure 16A:
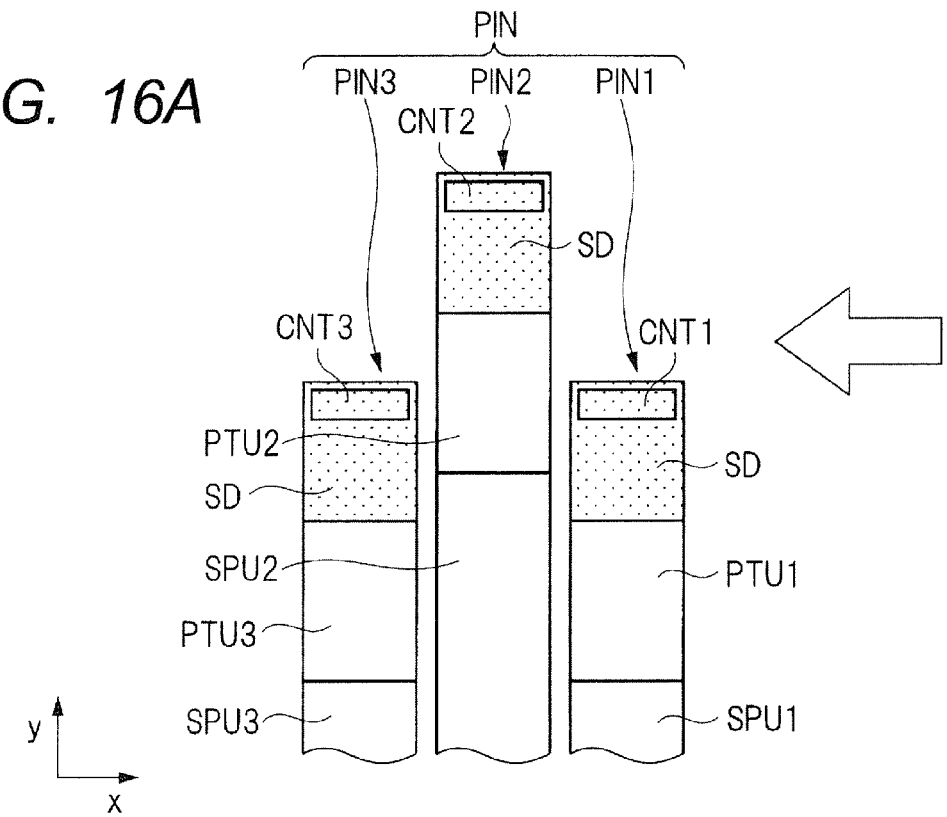
FIG. 16A is a top view showing a state in which an inspection step in the modification 1 is carried out plural times to thereby adhere a solder material to a contact pin.
Figure 16B:
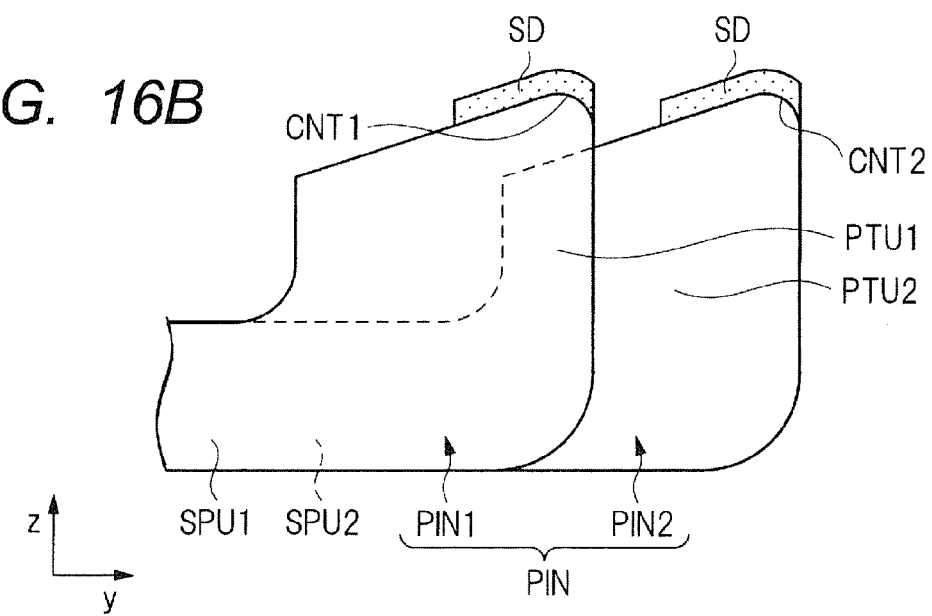
FIG. 16B is a side view as viewed from the direction indicated by an arrow in FIG. 16A.

Specifically, FIG. 16A is a top view showing a state in which an inspection step in the present modification 1 is carried out plural times to thereby adhere a solder material SD to the contact pin PIN. FIG. 16B is a side view as seen from the direction indicated by an arrow in FIG. 16A. It is understood that in FIGS. 16A and 16B, the solder material SD is adhered to the periphery of the contact part CNT1 of the tip portion PTU1 formed at the contact pin PIN1, the solder material SD is adhered to the periphery of the contact part CNT2 of the tip portion PTU2 formed at the contact pin PIN2, and the solder material SD is adhered to the periphery of the contact part CNT3 of the tip portion PTU3 formed at the contact pin PIN3.

At this time, in the present modification 1, the tip portion PTU1 of the contact pin PIN1, the tip portion PTU2 of the contact pin PIN2, and the tip portion PTU3 of the contact pin PIN3 are arranged in zigzag so as to be shifted along the y direction in the horizontal plane (xy plane). Therefore, as can be seen from FIGS. 16A and 16B, the position of adhesion of the solder material SD to the tip portion PTU1 of the contact pin PIN1, the position of adhesion of the solder material SD to the tip portion PTU2 of the contact pin PIN2, and the position of adhesion of the solder material SD to the tip portion PTU3 of the contact pin PIN3 are shifted from one another. This means that the solder material SD adhered to the contact pin PIN1, the solder material SD adhered to the contact pin PIN2, and the solder material SD adhered to the contact pin PIN3 are hard to be connected to each other. As a result, according to the present modification 1, it becomes hard to cause a solder bridge between the contact pin PIN1, the contact pin PIN2, and the contact pin PIN3. That is, in the present modification 1, the solder bridge between the contact pin PIN1, the contact pin PIN2, and the contact pin PIN3 is suppressed even if the inspection step is carried out many times. From this point, a current dispersion effect by configuring the contact pin PIN from the set of contact pins PIN1, PIN2 and PIN3 independent of each other can be maintained even after the inspection step is carried out many times. Thus, according to the present modification 1, the potential for generation of the sparks at the contact pin PIN can be reduced even if the inspection step is carried out plural times. Consequently, the life prolongation of the contact pin PIN can be achieved.

In particular, since the contact pin PIN in the present modification 1 is comprised of the three contact pins PIN1 to PIN3, a large current dispersion effect can be obtained. Thus, according to the present modification 1, the potential for the generation of the sparks can be reduced by the large current dispersion effect. As a result, the life prolongation of the contact pin PIN can be achieved.

Figure 17:
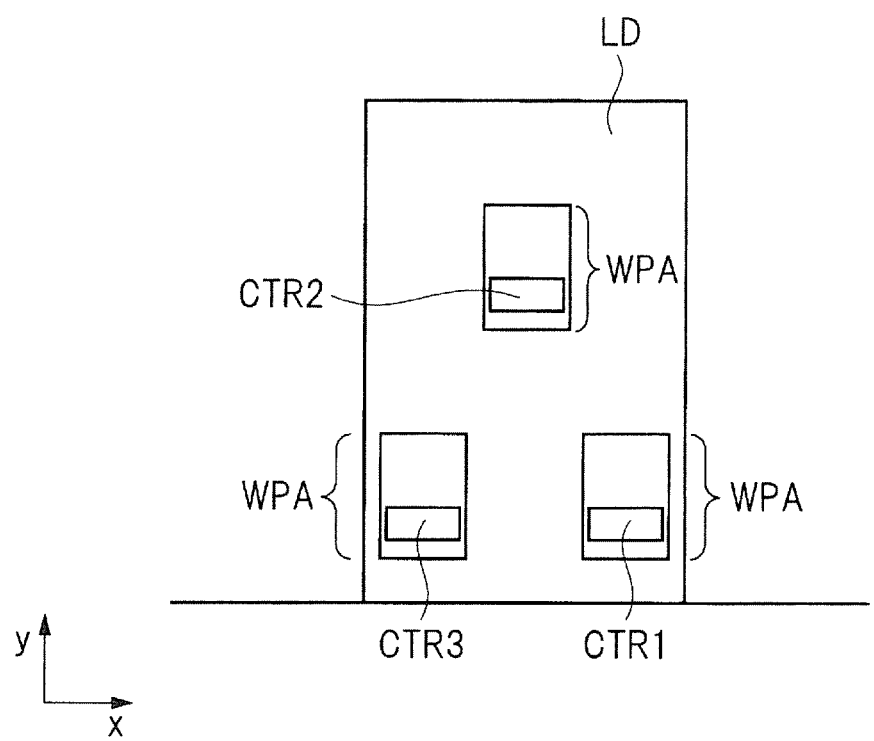
FIG. 17 is a plan diagram typically showing traces formed in a lead as a result of contact of the contact pin in the modification 1 with the lead.
Figure 18:
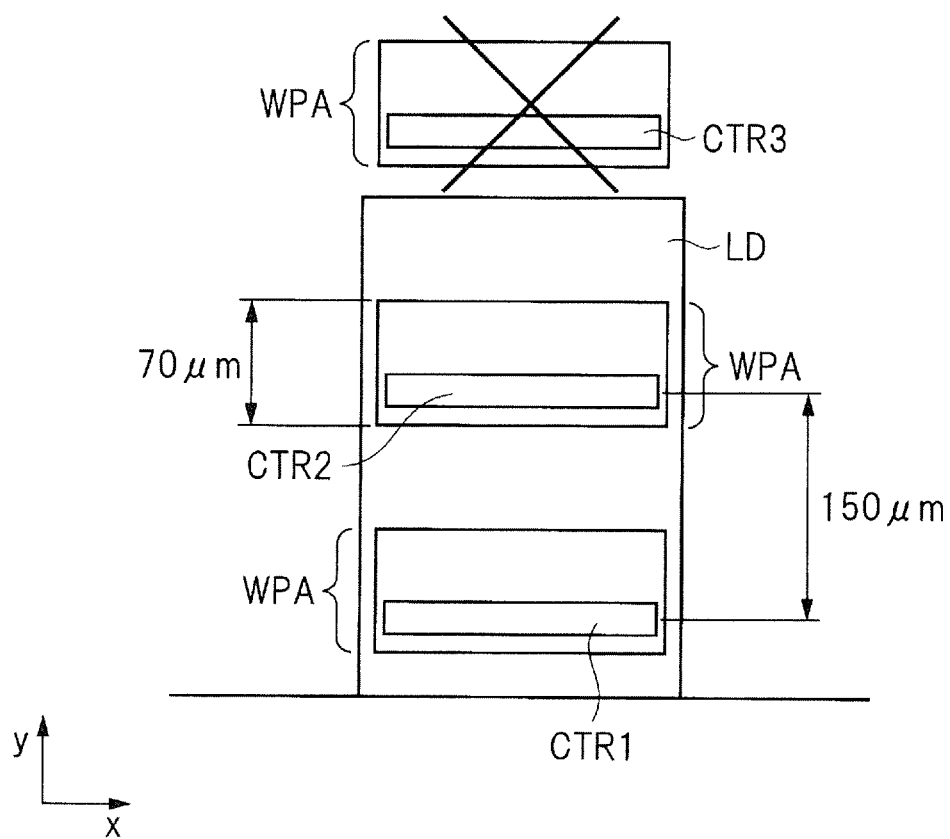
FIG. 18 is a diagram typically showing that part of a contact pin is protruded from a lead in a related art.

FIG. 17 is a plan diagram typically showing traces formed in the lead LD as a result of contact of the contact pin PIN in the present modification 1 with the lead LD. As shown in FIG. 17, the three traces are formed in the surface of the lead LD in zigzag while reflecting that the contact pin PIN in the present modification 1 is comprised of the three contact pins PIN1 to PIN3 arranged in zigzag. Specifically, one trace is formed in the range of a wiping amount WPA from a contact area CTR1, another trace is formed in the range of a wiping amount WPA from a contact area CTR2, and a further trace is formed in the range of a wiping amount WPA from a contact area CTR3. Since, at this time, the contact pins PIN1 to PIN3 configuring the contact pin PIN in the preset modification 1 are arranged in zigzag side by side along the x direction (first direction) in the horizontal plane (xy plane), there can be obtained an advantage that three point contact between the lead LD and the contact pin PIN can be realized even without the size of the lead LD being made large.

For example, when an attempt is made to realize the three point contact between the lead LD and the contact pin PIN in the configuration of the related art shown in FIG. 14 in which the support portion SPU1 and the support portion SPU2 are arranged side by side along the vertical direction (z direction), part of the contact pin PIN is protruded from the lead LD if the size of the lead LD remains small, so that the three point contact cannot be realized. That is, when an attempt is made to realize the three point contact while securing a suitable wiping amount WPA in the case of the configuration of the related art, the size of the lead LD must be increased.

On the other hand, according to the present modification 1, there has been adopted the characteristic configuration that the contact pins PIN1 to PINS configuring the contact pin PIN are arranged in zigzag side by side along the x direction (first direction) in the horizontal plane (xy plane). As a result, there can be obtained a remarkable effect that securing of the wiping amount WPA and the three point contact can both be realized even while maintaining the size of the lead LD to be small and that they cannot be realized in the configuration of the related art.

Modification 2

Although the above embodiment has been described by taking the QFN and QFP as the package forms of the semiconductor device, the technical idea in the above embodiment is not limited to this, but can widely be applied even to a semiconductor device comprised of a package form such as an SON, an SOP or the like.

Modification 3

Although the above embodiment has described the example using the so-called piece mold technique in which each individual sealing body is formed with respect to each individual semiconductor device as the sealing structure of the semiconductor device, the technical idea in the above embodiment is not limited to this, but can be applied even to a semiconductor device having a sealing body using a batch mold technique (MAP: Mold Array Package).

Modification 4

A plating film (solder material) is not limited to a plating film using so-called lead-free solder, which substantially contains no lead (Pb), but may use a solder material containing lead (Pb). Also, an alloy film with bismuth (Bi) made to contain in tin (Sn) may be used as the plating film. Further, when it is not necessary to particularly consider wettability of a solder material in the step of mounting a semiconductor device over a mounting board (motherboard), the plating film may not necessarily be formed in the surface of a lead (external terminal). That is, the technical idea in the present embodiment can be applied not only to a semiconductor device in which a plating film is formed in the surface of a lead, but also applied widely to a semiconductor device in which a plating film is not formed in the surface of a lead.

For example, the generation of the sparks due to the mechanism shown in FIG. 6 is attributable to the fact that the solder material is adhered to the contact pin. Other than this, however, for example, a foreign material is considered to be caught in the contact part between the lead and the contact pin. In this case, the contact resistance of the contact part increases and the sparks are likely to occur. However, according to the technical idea in the above embodiment, the contact parts are secured with respect to one lead to thereby make it hard to cause an increase in the contact resistance due to the foreign material, thus making it possible to suppress the generation of the sparks. That is, the technical idea in the above embodiment is considered to be effective not only for the suppression of the generation of the sparks due to the oxidation of the solder material, but also for the suppression of the generation of the sparks due to the foreign material.

Further, according to the current dispersion effect inevitably brought about from the technical idea in the above embodiment, a decrease in the amount of a voltage drop due to a decrease in current flowing through one contact part can be achieved. Even from this point, the sparks become hard to occur and hence the life prolongation of the contact pin can be achieved. Further, it is considered that since the potential for the generation of the sparks exists due to the surface oxidation of the lead even if no plating film exists in the surface of the lead, the generation of the sparks becomes harder to occur with the stability of the contact resistance and the reduction in the contact resistance both brought about by the multipoint contact by the above embodiment. Besides, even if the sparks have occurred, the amount of current flowing at the sparks is reduced by the current dispersion effect, thereby making it possible to reduce damage to the contact pin by the sparks. Even from this viewpoint, according to the above embodiment, the life prolongation of the contact pin can be achieved.

It is understood from the above that the technical idea in the above embodiment is useful not only for the semiconductor device in which the plating film is formed in the surface of the lead, but also for the semiconductor device in which the plating film is not formed in the surface of the lead.

Modification 5

Further, the modifications can also be applied in combination with each other within the scope not departing from the gist of the technical idea described in the above embodiment.

In addition, part of the contents described in the above embodiment will be described below.

APPENDIX 1

A method of inspecting a semiconductor device, which includes the following steps of:

(a) setting the semiconductor device including external terminals each having an exposed first surface to a jig and contacting a contact pin with the first surface of the external terminal; and (b) after the step (a), inspecting electrical characteristics of the semiconductor device by supplying a current to the external terminal through the contact pin, in which the contact pin is comprised of a first contact pin including a first tip portion to be contacted with a first portion of the external terminal, and a second contact pin including a second tip portion to be contacted with a second portion of the external terminal, the first contact pin includes a first support portion, and the first tip portion connected to the first support portion, the second contact pin includes a second support portion, and the second tip portion connected to the second support portion, the first support portion of the first contact pin and the second support portion of the second contact pin are arranged side by side along a first direction parallel to a lower surface of a sealing body, and the second tip portion of the second contact pin is shifted from the first tip portion of the first contact pin along a second direction parallel to the lower surface of the sealing body and also intersecting with the first direction.

What is claimed is:

1. A method of inspecting a semiconductor device, comprising the steps of:
    (a) electrically connecting a semiconductor chip and an external terminal;
    (b) after the step (a), sealing the semiconductor chip with resin such that a first surface of the external terminal is exposed, and forming a sealing body;
    (c) after the step (b), setting the semiconductor device to a jig, and contacting a contact pin with the first surface of the external terminal; and
    (d) after the step (c), inspecting electrical characteristics of the semiconductor device by supplying a current to the external terminal through the contact pin,
    wherein the contact pin is comprised of a first contact pin including a first tip portion to be contacted with a first portion of the external terminal, and a second contact pin including a second tip portion to be contacted with a second portion of the external terminal,
    wherein the first contact pin includes a first support portion, and the first tip portion connected to the first support portion,
    wherein the second contact pin includes a second support portion, and the second tip portion connected to the second support portion,
    wherein the first support portion of the first contact pin and the second support portion of the second contact pin are arranged side by side along a first direction parallel to a lower surface of the sealing body, and
    wherein the second tip portion of the second contact pin is shifted from the first tip portion of the first contact pin along a second direction parallel to the lower surface of the sealing body and also intersecting with the first direction.

2. The method according to claim 1, wherein the position of the first support portion of the first contact pin in a direction intersecting with the lower surface of the sealing body is equal to the position of the second support portion of the second contact pin in a direction intersecting with the lower surface of the sealing body.

3. The method according to claim 1, wherein the second direction is a direction in which the first support portion of the first contact pin extends, and a direction in which the second support portion of the second contact pin extends.

4. The method according to claim 1, wherein the length in the extending direction of the first support portion and the length in the extending direction of the second support portion are different from each other.

5. The method according to claim 1, wherein the first support portion of the first contact pin and the second support portion of the second contact pin are arranged spaced away from each other in the first direction.

6. The method according to claim 1, wherein the curvature radius of a first bent portion connected to a portion on the side opposite to a portion to which the first tip portion is connected, of the first support portion, and the curvature radius of a second bent portion connected to a portion on the side opposite to a portion to which the second tip portion is connected, of the second support portion are equal to each other in sectional view.

7. The method according to claim 1, wherein the shape of the first tip portion and the shape of the second tip portion are equal to each other.

8. The method according to claim 7, wherein the position of the first tip portion in the direction interesting with the lower surface of the sealing body, and the position of the second tip portion in the direction intersecting with the lower surface of the sealing body are equal to each other.

9. The method according to claim 1,
wherein the contact pin further includes a third contact pin provided with a third tip portion to be contacted with a third portion of the external terminal,
wherein the third contact pin has a third support portion, and the third tip portion connected to the third support portion,
wherein the first support portion of the first contact pin, the second support portion of the second contact pin, and the third support portion of the third contact pin are arranged side by side along the first direction, and
wherein the third tip portion of the third contact pin is shifted from the second tip portion of the second contact pin along the second direction.

10. The method according to claim 9, wherein the first tip portion of the first contact pin and the third tip portion of the third contact pin are equal to each other in position as viewed in the second direction.

11. The method according to claim 1, wherein after the contact pin is brought into contact with the first surface of the external terminal, the (c) step performs a wiping operation for rubbing the first tip portion and the second tip portion against the first surface along the extending directions of the first support portion and the second support portion.

12. The method according to claim 11, wherein each of the amounts of shifting in the second direction of the first tip portion of the first contact pin and the second tip portion of the second contact pin is twice or more the wiping amount of the wiping operation.

13. A method for manufacturing a semiconductor device, comprising the steps of:
(a) electrically connecting a semiconductor chip and an external terminal;
(b) after the step (a), sealing the semiconductor chip with resin such that a first surface of the external terminal is exposed, and forming a sealing body;
(c) after the step (b), forming a conductor film over the first surfaces of the external terminals;
(d) after the step (c), setting the semiconductor device to a jig and contacting a contact pin with the conductor film; and
(e) after the step (d), inspecting electrical characteristics of the semiconductor device by supplying a current to the external terminal through the contact pin,
wherein the contact pin is comprised of a first contact pin including a first tip portion to be contacted with a first portion of the external terminal, and a second contact pin including a second tip portion to be contacted with a second portion of the external terminal,
wherein the first contact pin includes a first support portion, and the first tip portion connected to the first support portion,
wherein the second contact pin includes a second support portion, and the second tip portion connected to the second support portion,
wherein the first support portion of the first contact pin and the second support portion of the second contact pin are arranged side by side along a first direction parallel to a lower surface of the sealing body, and
wherein the second tip portion of the second contact pin is shifted from the first tip portion of the first contact pin along a second direction parallel to the lower surface of the sealing body and also intersecting with the first direction.

14. The method according to claim 13, wherein the conductor film is a solder film.

15. The method according to claim 13, wherein the second direction is a direction in which the first support portion of the first contact pin extends, and a direction in which the second support portion of the second contact pin extends.

16. The method according to claim 13, wherein the length in the extending direction of the first support portion and the length in the extending direction of the second support portion are different from each other.

17. The method according to claim 13, wherein the curvature radius of a first bent portion connected to a portion on the side opposite to a portion to which the first tip portion is connected, of the first support portion, and the curvature radius of a second bent portion connected to a portion on the side opposite to a portion to which the second tip portion is connected, of the second support portion are equal to each other in sectional view.

18. The method according to claim 13, wherein after the contact pin is brought into the first surface of the external terminal, the (d) step performs a wiping operation for rubbing the first tip portion and the second tip portion against the first surface along the extending directions of the first support portion and the second support portion.

19. The method according to claim 18, wherein each of the amounts of shifting in the second direction of the first tip portion of the first contact pin and the second tip portion of the second contact pin is twice or more the wiping amount of the wiping operation.

* * * * *